(12) United States Patent
Ikeda et al.

(10) Patent No.: US 6,787,383 B2
(45) Date of Patent: Sep. 7, 2004

(54) LIGHT-EMITTING DEVICE AND METHOD FOR MANUFACTURING THE SAME

(75) Inventors: Shunichi Ikeda, Annaka (JP); Masato Yamada, Annaka (JP); Nobuhiko Noto, Annaka (JP); Shinji Nozaki, Kanagawa (JP); Kazuo Uchida, Tokyo (JP); Hiroshi Morisaki, Tsurugashima (JP)

(73) Assignees: Shin-Etsu Hanotai Co., Ltd., Tokyo (JP); Nanoteco Corporation, Tokyo (JP)

( * ) Notice: Subject to any disclaimer, the term of this patent is extended or adjusted under 35 U.S.C. 154(b) by 0 days.

(21) Appl. No.: 10/255,000

(22) Filed: Sep. 26, 2002

(65) Prior Publication Data

US 2003/0059972 A1 Mar. 27, 2003

(30) Foreign Application Priority Data

Sep. 27, 2001 (JP) ...................................... 2001-297927
Sep. 4, 2002 (JP) ...................................... 2002-259396

(51) Int. Cl.[7] .......................... H01L 21/00; H01L 33/00

(52) U.S. Cl. ............................. 438/44; 438/39; 438/22; 438/602; 438/46; 438/47; 438/455; 438/35; 257/102; 257/97; 257/99; 257/79; 257/85; 257/81; 257/98

(58) Field of Search ............................. 438/44, 39, 22, 438/602, 455, 46, 47, 29, 35; 257/94, 97, 99, 98, 79, 85, 96, 81, 102, 103

(56) References Cited

U.S. PATENT DOCUMENTS 6,350,997 B1 * 2/2002 Saeki et al. .................. 257/102
6,420,732 B1 * 7/2002 Kung et al. .................... 257/79
6,512,248 B1 * 1/2003 Takeuchi et al. .............. 257/81

FOREIGN PATENT DOCUMENTS

JP    1-225178    9/1989
JP    6-188455    7/1994

OTHER PUBLICATIONS

Lakhani, Amir A., "The role of compound formation and heteroepitaxy in indium–based ohmic contacts to GaAs," *Journal of Applied Physics*, Sep. 15, 1984, pp. 1888–1891, vol. 56, No.6.

Marvin, Dean C. et al., "In/Pt ohmic contacts to GaAs," *Journal of Applied Physics*, Oct. 1, 1985, pp. 2659–2661, vol. 58, No. 7.

Tokumitsu, E. et al., "Heavily carbon–doped p–type InGaAs by MOMBE," *Journal of Crystal Growth*, 1992, pp. 301–305, vol. 120, Elsevier Science Publishers B.V.

* cited by examiner

*Primary Examiner*—Matthew Smith
*Assistant Examiner*—Igwe U. Anya
(74) *Attorney, Agent, or Firm*—Snider & Associates; Ronald R. Snider

(57) ABSTRACT

The light-emitting device 100 has an ITO electrode layer 8 for applying drive voltage for light emission to a light emitting layer section 24, where the light from the light emitting layer section 24 is extracted as being passed through the ITO electrode layer 8. Between the light emitting layer section 24 and the ITO electrode layer 8, an electrode contact layer 7 composed of In-containing GaAs is located so as to contact with such ITO electrode layer 8, where occupied areas and unoccupied areas for the electrode contact layer 7 are arranged in a mixed manner on the contact interface with the transparent electrode layer 8. The electrode contact layer 7 can be obtained by annealing a stack 13, which comprises a GaAs layer 7" formed on the light emitting layer section 24 and the ITO electrode layer 8 formed so as to contact with the GaAs layer 7", to thereby allow In to diffuse from the ITO electrode layer to the GaAs layer 7".

35 Claims, 12 Drawing Sheets

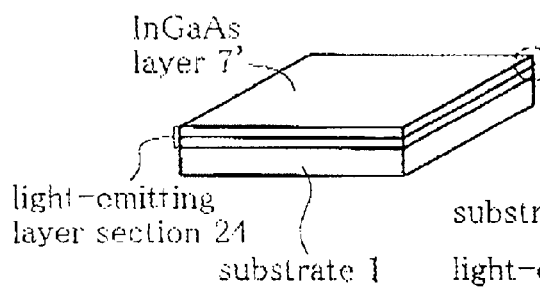
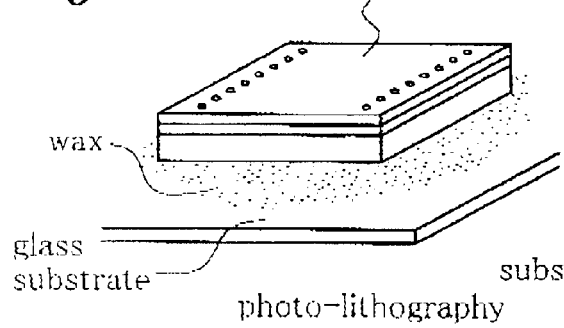
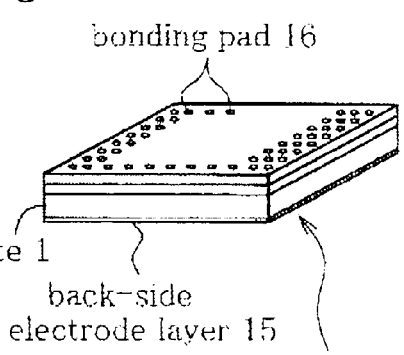
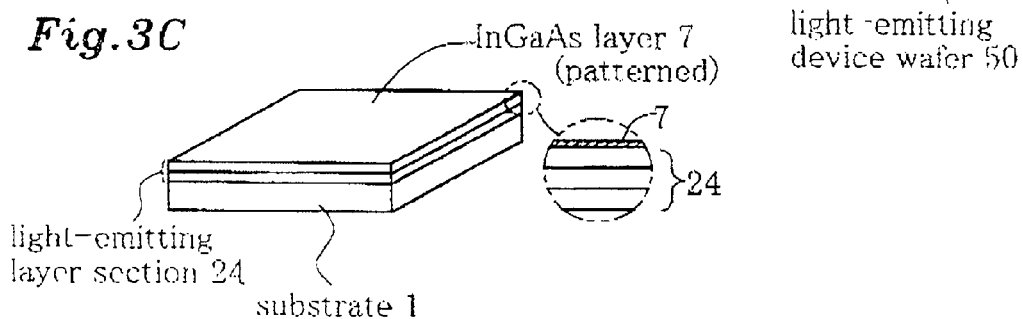
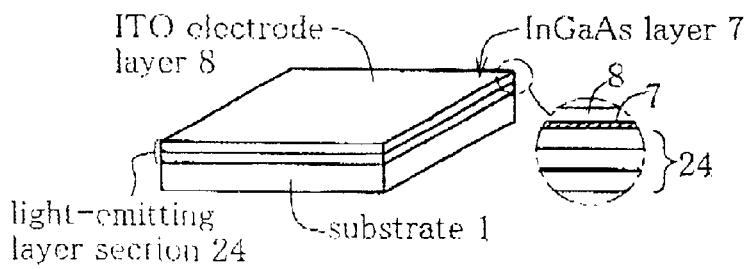

Fig. 5
(a)
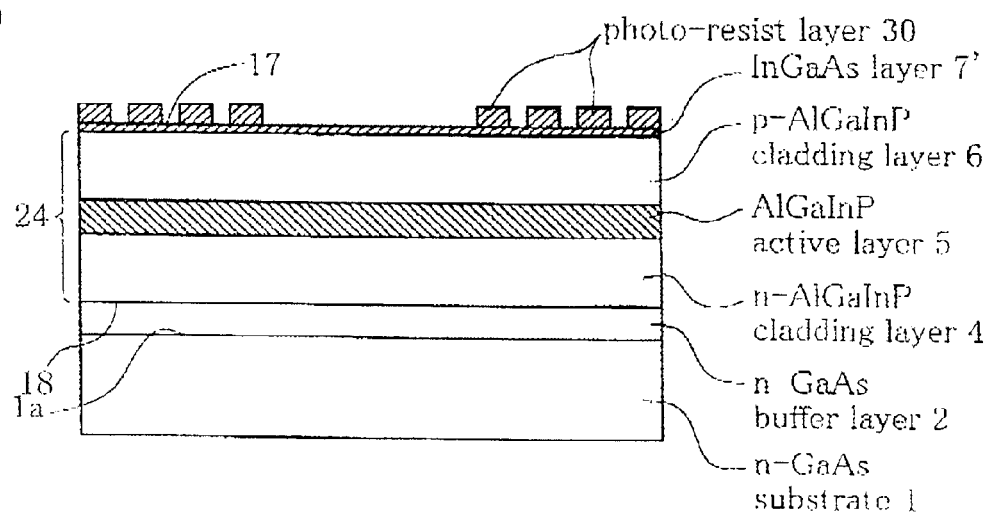
(b)
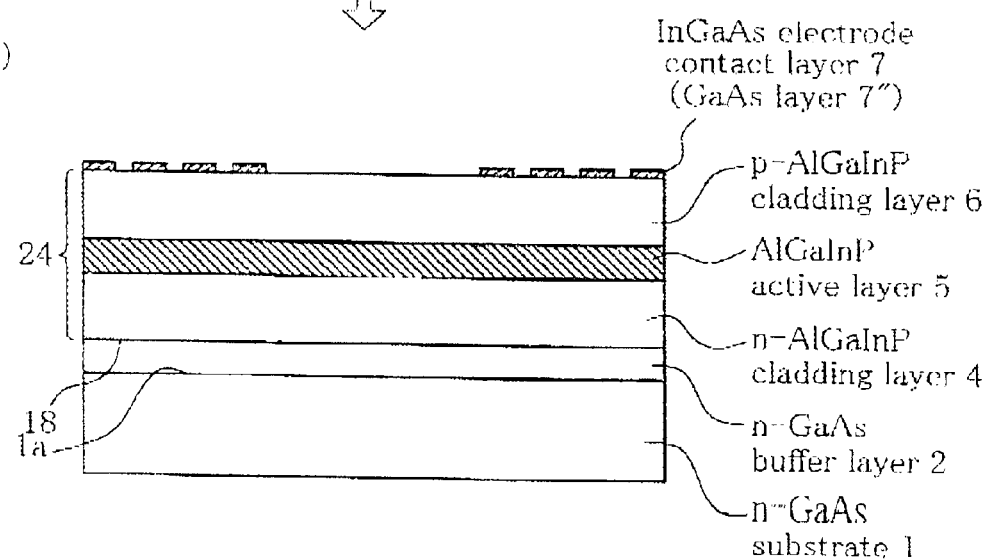

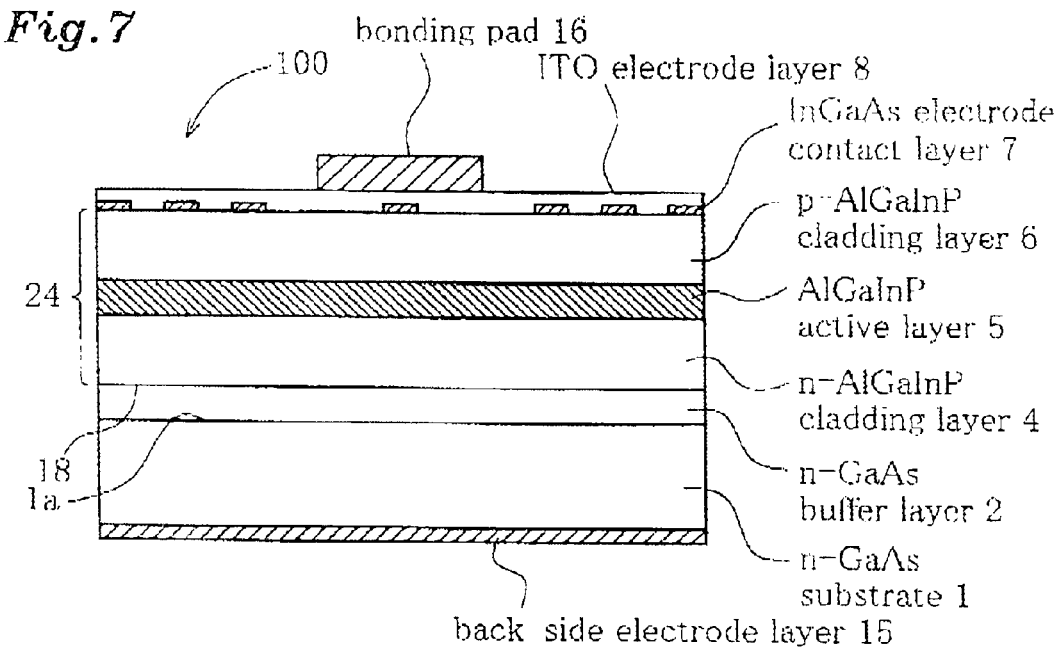
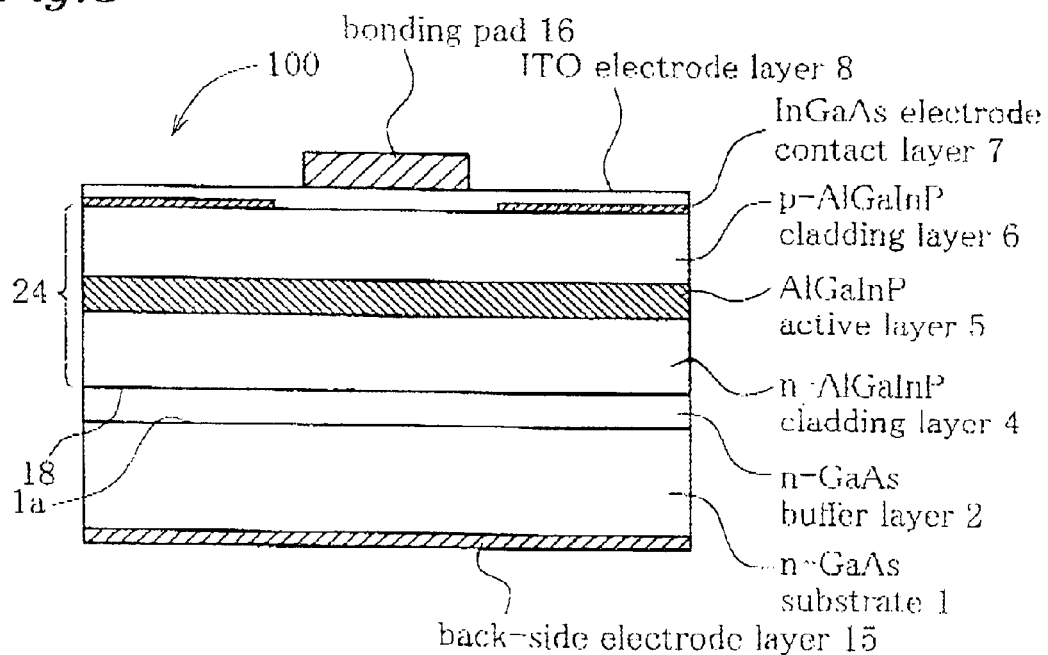

LIGHT-EMITTING DEVICE AND METHOD FOR MANUFACTURING THE SAME

RELATED APPLICATIONS

This application claims the priority of Japanese Patent Applications No. 2001-297927 filed on Sep. 27, 2001 and No. 2002-259396 filed on Sep. 4, 2002, which are incorporated herein by reference.

BACKGROUND OF THE INVENTION

1. Field of the Invention

The present invention relates to a light-emitting device and a method for manufacturing thereof.

2. Related Art

A light-emitting device whose light emitting layer section is composed of $(Al_xGa_{1-x})_yIn_{1-y}P$ alloy (where $0 \leq x \leq 1$ and $0 \leq y \leq 1$, which may simply be expressed as AlGaInP alloy, or more simply as AlGaInP, hereinafter) can be provided as a high-luminance device when it employs a double heterostructure in which a thin AlGaInP active layer is placed between an n-type AlGaInP cladding layer and a p-type AlGaInP cladding layer, both of which having a larger band gap than that of the AlGaInP active layer. Recent efforts have also succeeded in putting a blue light-emitting device into practical use, which device having formed therein a similar double heterostructure using $In_xGa_yAl_{1-x-y}N$ (where $0 \leq x \leq 1$, $0 \leq y \leq 1$ and $x+y \leq 1$).

Referring now to an AlGaInP light-emitting device, a light emitting layer section thereof having the double heterostructure is formed by stacking an n-type GaAs buffer layer, an n-type AlGaInP cladding layer, an AlGaInP active layer and a p-type AlGaInP cladding layer, all of which layers are grown in this order on an n-type GaAs substrate by hetero epitaxial growth process. Current supply to the light emitting layer section is effected through metal electrodes formed on the surface of the device. The metal electrodes are typically formed so as to cover only a center portion of the main surface of the light emitting layer section since it can otherwise serve as a light interceptor, which allows the light to be extracted from the peripheral area having no electrode formed therein.

An area of the metal electrode as small as possible in this case can ensure a larger area for light leakage around the electrode, which is advantageous in that improving the light extraction efficiency. Previous efforts have been made in increasing the amount of extracted light by modifying shape of the electrode so as to effectively spread electric current throughout the device. This strategy is, however, still suffering from an inevitable problem of increasing area of the electrode, which raises a dilemma such that decreased area for light leakage undesirably limits the amount of extracted light. There is now another proposal of raising the light extraction efficiency by covering the main surface of the light emitting layer section with an ITO (indium tin oxide) electrode layer having a high conductivity in place of using the metal electrodes, which is typically disclosed in Japanese Laid-Open Patent Publication No. 6-188455 or No. 1-225178.

Investigations by the present inventors, however, revealed that contact resistance with a compound semiconductor layer on the device side tends to become high by using the ITO-made transparent electrode layer as it is, which inevitably degrades the emission efficiency due to increase in series resistance. One typical method to reduce contact resistance is proposed in Japanese Laid-Open Patent Publication No. 1-225178, according to which an electrode contact layer composed of an InGaAs layer is provided between the ITO electrode layer and a semiconductor layer on the device side so as to be corresponded to the entire surface of the ITO electrode layer. It is, however, essential for this case that the electrode contact layer is made of InGaAs or the like having a low band gap energy in order to ensure ohmic contact, so that even an extremely small thickness thereof will inevitably result in degradation in the light extraction efficiency due to absorption of the light. Even for the case where the transparent electrode is used, a problem will still remain in a phase of manufacturing devices in that a metal bonding pad to which a wire for current supply is bonded must be arranged on the transparent electrode. This, however, tends to concentrate drive voltage to the areas where the highly-conductive metal bonding pad is formed, and tends to lower the light extraction efficiency due to poor current supply in the area around the pad, which serves as a light extraction area, so that it may not be always sure that using the transparent electrode promises effects to a sufficient degree.

SUMMARY OF THE INVENTION

Accordingly, the present invention is to provide a light-emitting device having an oxide transparent electrode layer as an electrode for driving light emission, and being capable of enhancing effect of improving the light extraction efficiency exhibited by such oxide transparent electrode layer, and also is to provide a method for manufacturing such light-emitting device.

The light-emitting device of the present invention premises that it has a light emitting layer section which comprises a compound semiconductor layer, and an oxide transparent electrode layer for applying drive voltage for light emission to the light emitting layer section, and that it is composed so that the light from the light emitting layer section can be extracted through the oxide transparent electrode layer, where a feature of the device resides in that an electrode contact layer for reducing contact resistance of the oxide transparent electrode layer is arranged between the light emitting layer section and the oxide transparent electrode layer so as to contact with such oxide transparent electrode layer, where on a contacting interface of such oxide transparent electrode layer, occupied areas and unoccupied areas for the electrode contact layer are arranged in a mixed manner. The electrode contact layer preferably comprises a compound semiconductor.

As has been described in the above, an oxide transparent electrode layer typically composed of ITO cannot always ensure a desirable ohmic contact even though a trial is made on bringing such layer into direct contact with a compound semiconductor layer on the device side, which may result in degraded emission efficiency due to increased series resistance based on the contact resistance. Whereas, the light-emitting device of the present invention is successful in reducing contact resistance of the oxide transparent electrode layer by placing the electrode contact layer for reducing contact resistance of the oxide transparent electrode layer so as to be brought into contact with the device side of such oxide transparent electrode layer. Further, the occupied areas and unoccupied areas for the electrode contact layer are arranged in a mixed manner on the contacting interface of the oxide transparent electrode layer, so that the light absorption by the electrode contact layer can successfully be reduced even when such electrode contact layer is, by nature, very likely to absorb the light from the light emitting layer section, since the light generated just under the occupied area for the electrode contact layer can leak through the non-occupied area adjacent thereto. Such formation of the electrode contact layer can successfully raise the light extraction efficiency of the device as a whole.

The electrode contact layer formed so as to cover the entire portion of the contact plane on the device side of the oxide transparent electrode layer will, however, result in the problems below:

(1) contact resistance of the oxide transparent electrode layer is reduced even in an area just under the bonding pad used for wire bonding, but this undesirably tends to concentrate the drive current, and consequently light emission, within such area, where much portion of the emitted light is shielded by the bonding pad and thus light extraction efficiency will be degraded; and (2) the electrode contact layer may serve as a light absorber depending on material species of compound semiconductor used therefor, which will similarly result in degradation of the light extraction efficiency.

To solve these problems, a feature of the light-emitting device according to a first aspect of the present invention resides in that the contacting interface of the oxide transparent electrode layer has a first zone which comprises an area just under a bonding pad placed on such oxide transparent electrode layer and a second zone which comprises the residual area therearound, where the second zone is larger in the amount of extracted light than the first zone, and the electrode contact layer is formed with a larger ratio of occupied area in the second zone than in the first zone.

According to such constitution, ratio of occupied area of the electrode contact layer formed on the contacting interface of the oxide transparent electrode layer is smaller in the area (first zone) just under the bonding pad, which extracts a less amount of light, than in the residual area (second zone) which extracts a larger amount of extracted light, so that the first zone will have an increased contact resistance of the oxide transparent electrode layer. This resultantly increases a component of the drive current for the light-emitting device, which flows into the second zone while bypassing the first zone, and successfully enhances the light extraction efficiency to a significant degree. It is now preferable in view of increasing the light extraction efficiency that the drive current for light emission does not, as possible, flow through the first zone which extracts a less amount of light. It is therefore preferable that the first zone has formed therein no electrode contact layer as possible. It is also preferable that the occupied areas and unoccupied areas for the electrode contact layer are arranged in a mixed manner at least in the second zone in the contacting interface of the oxide transparent electrode, which second zone extracts larger amount of light.

The light-emitting device according to a second aspect of the present invention premises that it has a light emitting layer section which comprises a compound semiconductor layer and an oxide transparent electrode layer for applying drive voltage for light emission to the light emitting layer section, and that the device is composed so that the light from the light emitting layer section can be extracted through the oxide transparent electrode layer, where a feature of the device resides in that an electrode contact layer, composed of a compound semiconductor, for reducing contact resistance of the oxide transparent electrode layer is arranged between the light emitting layer section and the oxide transparent electrode layer so as to contact with such oxide transparent electrode layer; the contacting interface of the oxide transparent electrode layer has a first zone which comprises an area just under bonding pads and a second zone which comprises the residual area, where the second zone is larger in the amount of extracted light than the first zone; and at least the second zone has formed therein the occupied areas and unoccupied areas for the electrode contact layer arranged in a mixed manner. The occupied areas for the electrode contact layer are preferable to be formed in a discrete manner.

According to such constitution, even if the electrode contact layer formed in order to reduce contact resistance of the oxide transparent electrode layer is very likely to absorb the light from the light emitting layer section, the light generated just under the occupied area for the electrode contact layer can leak through the adjacent non-occupied area, so that light absorption by the electrode contact layer is avoidable. This desirably enhances of the light extraction efficiency of the device as a whole.

Next discussion relates to the electrode contact layer, which electrode is excellent in reducing effect of contact resistance of the oxide transparent electrode layer and is preferably applicable to the present invention when it is composed of a compound semiconductor containing no Al at the contacting interface with the oxide transparent electrode layer and having a band gap energy of less than 1.42 eV. Possible reasons why the contact resistance of the oxide transparent electrode layer can be reduced by using such electrode contact layer are as follows:

(1) the oxide transparent electrode layer of a conventional light-emitting device for example was formed so as to be brought into contact with an AlGaAs current spreading layer, where AlAs alloy composition had to be considerably high in order to ensure a sufficient level of transparency of such current spreading layer. The AlGaAs alloy having a large AlAs alloy composition is, however, very likely to be oxidized since it contains Al in a high concentration, so that formation of the oxide transparent electrode layer allows oxygen contained therein to react with the Al component in the AlGaAs current spreading layer to thereby form an oxide layer having a high resistivity; and (2) the AlGaAs alloy having a large AlAs alloy composition generally used for the current spreading layer has, although variable with the alloy composition, a band gap energy of as high as 2.02 to 2.13 eV, which is disadvantageous in that achieving ohmic contact or a low-resistivity contact nearly equivalent thereto (typically $10^{-4}$ Ω·cm or below; these statuses of contact will generally be expressed as having ohmic contact status hereinafter). A problem similar to the case with AlGaAs may arise also when the oxide transparent electrode layer is directly stacked on the AlGaInP cladding layer without using the AlGaAs layer, since the band gap energy thereof is as high as 2.3 to 2.35 eV and Al is contained therein.

However by composing the electrode contact layer as described in the above at the contacting interface with the oxide transparent electrode layer, ohmic contact can readily be attained since the high-resistivity oxide layer is unlikely to be formed due to absence of Al in the contacting interface with the electrode contact layer, and since the band gap energy is small (less than 1.42 eV; which is typically 0.75 eV for $In_{0.5}Ga_{0.5}As$). This is successful in reducing contact resistance of the transparent electrode layer to a considerable degree. The compound semiconductor composing the electrode contact layer at the contacting interface with the oxide transparent electrode layer can more specifically be expressed as $In_xGa_{1-x}As$ ($0<x \leq 1$).

Materials composing the oxide transparent electrode layer can be those mainly comprising tin oxide ($SnO_2$) or indium oxide ($In_2O_3$). More specifically, ITO film having a high electric conductivity is preferably used for the oxide transparent electrode layer in the present invention. ITO film is an indium oxide film doped with tin oxide, where controlling the content of tin oxide within a range from 1 to 9 wt % can sufficiently suppress the resistivity of the electrode layer to as low as $5\times10^{-4}$ Ω·cm or less. Besides the ITO electrode layer, zinc oxide (ZnO) again having a high electric conductivity is applicable to the present invention. Still other materials available for the oxide transparent electrode layer include tin oxide doped with antimony oxide (so-called Nesa), $Cd_2SnO_4$, $Zn_2SnO_4$, $ZnSnO_3$, $MgIn_2O_4$, $CdSb_2O_6$ doped with yttrium (Y) oxide, and $GaInO_3$ doped with tin oxide. In short, the oxide transparent electrode layer can contain at least any one of indium, tin and zinc.

These oxide transparent electrode layers can be formed by known vapor phase film growth processes, examples of which include chemical vapor deposition process (CVD); physical vapor deposition (PVD) processes such as sputtering and vacuum evaporation; and molecular beam epitaxy (MBE) process. For example, ITO electrode layer and ZnO electrode layer can be produced by RF sputtering or vacuum evaporation, and Nesa film can be produced by CVD process. In place of these vapor-phase growth processes, it is also allowable to employ sol-gel process or other processes for the film growth.

The oxide transparent electrode layer can be formed so as to cover the entire surface of the main surface of the light emitting layer section. Such constitution is advantageous in that allowing the oxide transparent electrode layer to function as the current spreading layer, so that it is no more necessary to form a thick current spreading layer comprising a compound semiconductor as has previously been used, or the thickness thereof, even when it is to be formed, can considerably be reduced, which contributes cost reduction through simplifying the processes and is fairly beneficial from an industrial viewpoint. On the other hand, the thickness of the electrode contact layer need not be so thick provided that it is sufficient for achieving ohmic contact. More specifically for the case where a compound semiconductor composes the electrode contact layer, it is desirable to ensure a thickness which is not causative of shifting of the band gap energy from that of the bulk crystal after thinning, where a thickness of 0.001 μm or above will be sufficient (when In-containing GaAs, such as $In_xGa_{1-x}As$, is used). This advantageously shortens the inter-layer distance between the oxide transparent electrode layer and the light emitting layer section as compared with that in the conventional light-emitting device, and results in a larger reducing effect of the series resistance. It should now be noted that an excessively large thickness of the electrode contact layer comprising $In_xGa_{1-x}As$ undesirably increases light absorption by the electrode contact layer and thus lowers the light extraction efficiency, so that the thickness is preferably adjusted to 0.02 μm or below.

The light emitting layer section composed of $(Al_xGa_{1-x})_yIn_{1-y}P$ (where $0\leq x\leq 1$ and $0\leq y\leq 1$) or $In_xGa_yAl_{1-x-y}N$ (where $0\leq x\leq 1$, $0\leq y\leq 1$ and $x+y\leq 1$) contains Al for most cases and thus raises an issue of oxidative degradation, but adopting a constitution in which the oxide transparent electrode layer covers the entire surface thereof will be advantageous in that allowing such oxide transparent electrode layer to function as a passivation film for the light emitting layer section.

Although $In_xGa_{1-x}As$ is a compound semiconductor possibly having, depending on the alloy composition thereof, a little larger difference in lattice constant as compared with that of a compound semiconductor composing the light emitting layer section, adverse effect due to such lattice mismatching will be suppressed to a relatively small degree if it is formed as a thin layer having a thickness of approx. 0.001 to 0.02 μm, both ends inclusive. The electrode contact layer can thus be formed using this compound semiconductor.

When the electrode contact layer is formed using a compound semiconductor layer so as to directly contact with the oxide transparent electrode layer, it is preferable to use a compound semiconductor having a band gap energy of less than 1.42 eV at the contacting interface with the oxide transparent electrode layer in view of forming a desirable ohmic contact therewith, as described in the above. Since adverse effect of lattice mismatching can be relieved by the thinning as described in the above, it is also allowable to use InP, InAs, GaSb, InSb or alloy thereof, besides InGaAs.

The light emitting layer section comprising $(Al_xGa_{1-x})_yIn_{1-y}P$ or $In_xGa_yAl_{1-x-y}N$ can be composed as a double heterostructure which comprises a first conductivity type cladding layer, an active layer and a second conductivitytype cladding layer stacked in this order, which layers being respectively composed of the above-described $(Al_xGa_{1-x})_yIn_{1-y}P$ or $In_xGayAl_{1-x-y}N$. Energy barrier ascribable to difference in band gaps with the cladding layers formed on both sides of the active layer can effectively confine injected holes and electrons within a narrow active layer so as to promote recombination thereof, so that an extremely high emission efficiency can be attained. Further adjustment of component of the active layer can provide a wide range of light emission, where the former covers green to red region (peak emission wavelength falls within a range from 520 to 670 nm), and the latter covers ultraviolet to red region (peak emission wavelength falls within a range from 300 to 700 nm).

In the foregoing constitution, the electrode contact layer can be formed between the oxide transparent electrode layer and either of the first conductivity type cladding layer and second conductivity type cladding layer. For a typical case where only a main surface on one side of the light emitting layer section having a double heterostructure is used as a light extraction surface, the electrode contact layer is first formed between the cladding layer resides on that side and the oxide transparent electrode layer so as to contact with such oxide transparent electrode layer, and then the oxide transparent electrode layer can be formed. On the other hand, for a typical case where the main surfaces on both sides of the light emitting layer section are used as light extraction surfaces, the oxide transparent electrodes can be formed respectively for these cladding layers on both sides, and between the oxide transparent electrode and the cladding layer, the electrode contact layer can be formed so as to contact with such oxide transparent electrode layer.

It is also allowable to form an intermediate layer between the electrode contact layer and either of the cladding layers facing to the electrode contact layer, which is either of the first conductivity type cladding layer and the second conductivity type cladding layer, where the intermediate layer has an intermediate band gap energy between those of the electrode contact layer and such cladding layers. In order to enhance the carrier confinement efficiency into the active layer to thereby raise the internal quantum efficiency, it is necessary for the double heterostructured, light emitting layer section to have a barrier height between the cladding layer and the active layer raised to a certain level. As shown in a schematic band chart in FIG. 12 ($E_c$ represents an energy level of the bottom of the conduction band, and $E_v$ represents that of the top of the valence band), direct contacting of such cladding layer (AlGaInP layer, for example) with the electrode contact layer (InGaAs layer, for example) may sometimes result in generation of a relatively high hetero barrier therebetween due to contacting-induced bending of the energy band. The barrier height $\Delta E$ increases as the band-end discontinuity value between the cladding layer and the electrode contact layer increases, which is more likely to block carrier motion, in particular motion of holes having a larger effective mass. In a typical case using a metal electrode, coverage with such metal electrode over the entire surface of the cladding layer will prevent extracting of the light, so that the electrode must be formed only with a partial coverage. In this case, some strategy will be necessary to promote outward current spreading in the in-plane direction of the electrode in order to improve the light extraction efficiency. While many cases using the metal electrode employ an electrode contact layer typically composed of GaAs between the light emitting layer section and the metal electrode, it is more beneficial for the case where the metal electrode is used that a properly high barrier is formed between the electrode contact layer and the light emitting layer section in terms of promoting current spreading in the in-plane direction by virtue of carrier blocking effect expected from such barrier. However, formation of high barrier consequently results in increase in series resistance.

In contrast, it is almost unnecessary for the case using the ITO electrode layer to consider the carrier blocking effect expected from the barrier, since the ITO transparent electrode per se has a considerably high current spreading property. Still another advantage of using the ITO electrode layer is such that the area from which the light can be extracted increases to a considerable degree as compared with the case using the metal electrode. Inserting now the intermediate layer between the electrode contact layer and the cladding layer as shown in FIG. 13, which intermediate layer having an intermediate band gap energy between those of the electrode contact layer and such cladding layer, will successfully reduce band-edge discontinuity value between the electrode contact layer and the intermediate layer, and between the intermediate layer and the cladding layer, which consequently lowers the barrier heights $\Delta E$ respectively formed therebetween. This eventually reduces the series resistance, and makes it possible to achieve a sufficiently high luminous intensity even under a low drive voltage.

Effect of using the intermediate layer will be eminent in particular when the double heterostructured, light emitting layer section is formed using AlGaInP which has a relatively good lattice matching with the In-containing GaAs which composes the electrode contact layer. For this case, the intermediate layer having an intermediate band gap energy between those of the electrode contact layer and the cladding layer is preferably formed while containing at least one of AlGaAs layer, GaInP layer and AlGaInP layer (having a composition adjusted so as to suppress the band gap energy lower than that of the cladding layer), which is exemplified by such that including an AlGaAs layer. The intermediate layer is also applicable to any light emitting layer sections other than that described in the above, such as a double heterostructured, light emitting layer section typically composed of $In_xGa_yAl_{1-x-y}$. For this case, the intermediate layer is preferably such that including an InGaAlN layer (having a composition adjusted so as to suppress the band gap energy than that of the cladding layer).

Next, the method for manufacturing light-emitting device according to the present invention is such that manufacturing a light-emitting device having a light emitting layer section which is composed of $(Al_xGa_{1-x})_yIn_{1-y}P$ (where $0 \leq x \leq 1$ and $0 \leq y \leq 1$) as having a double heterostructure which comprises a first conductivity type cladding layer, an active layer and a second conductivity type cladding layer stacked in this order; and having an ITO electrode layer for applying drive voltage for light emission to such light emitting layer section provided on either side of the first conductivity type cladding layer and the second conductivity type cladding layer; which comprises the steps of:

forming a GaAs layer on the light emitting layer section so that occupied areas and unoccupied areas for the GaAs layer are arranged in a mixed manner;

forming the ITO transparent conductive layer so as to contact with the GaAs layer; and annealing the ITO electrode layer so as to allow In contained therein to diffuse into the GaAs layer to thereby convert such GaAs layer into an In-containing electrode contact layer.

In the method for manufacturing light-emitting device of the present invention, a GaAs layer is formed on the light emitting layer section which is composed of AlGaInP, and an ITO electrode layer is formed so as to contact with the GaAs layer. The light emitting layer section is typically composed of a III–V group compound semiconductor, and can typically be formed by known MOVPE process together with the GaAs layer formed thereon (where interposition of any other lattice-matched layer permissible). The GaAs layer can very easily establish lattice matching with the AlGaInP light emitting layer section, and can be formed with better uniformity and continuity as compared with those of an InGaAs layer directly formed thereon by the epitaxial growth process.

The ITO electrode layer is formed on the GaAs layer, and is then annealed so as to diffuse In from the ITO electrode layer towards the GaAs layer to thereby convert it into the electrode contact layer. Thus annealed electrode contact layer which is composed of In-containing GaAs will never have an excessive In content, and can effectively prevent quality degradation such as lowered luminous intensity. Since the lattice matching between the GaAs layer and the light emitting layer section will be especially desirable when the light emitting layer section is composed of $(Al_xGa_{1-x})_yIn_{1-y}P$ (where $0 \leq x \leq 1$ and $0.45 \leq y \leq 0.55$), so that it is preferable to form the light emitting layer section (cladding layer or active layer) while setting the alloy composition "y" within the above range.

The foregoing annealing is preferably carried out so that the electrode contact layer will have a distribution of the In concentration along the thickness-wise direction thereof such that continuously decreasing as the distance from the ITO electrode layer increases (that is, creating an In concentration gradient) as shown by line ① in FIG. 16. Such constitution is attainable by allowing under annealing In to spread from the ITO side to the electrode contact layer side.

In the light-emitting device of the present invention in this case, the light emitting layer section is composed of $(Al_xGa_{1-x})_yIn_{1-y}P$ (where $0 \leq x \leq 1$ and $0 \leq y \leq 1$) as having a double heterostructure which comprises the first conductivity type cladding layer, the active layer and the second conductivity type cladding layer stacked in this order, an ITO electrode layer as the oxide transparent electrode for applying drive voltage for light emission to the light emitting layer section is provided on either side of the first conductivity type cladding layer and the second conductivity type cladding layer so that the light from the light emitting layer section can be extracted through such ITO electrode layer, the electrode contact layer composed of In-containing GaAs is formed so as to contact with such ITO electrode layer, and the electrode contact layer has a distribution of the In concentration along the thickness-wise direction thereof such that continuously decreasing as the distance from the ITO electrode layer increases. This means that, on the side closer to the light emitting layer section which is composed of AlGaInP, the electrode contact layer has a lower In concentration, in other words, that difference in the lattice constant with that of the light emitting layer section decreases. Formation of the electrode contact layer having such In concentration distribution is beneficial in that further improving lattice matching with the light emitting layer section. Excessively high annealing temperature or excessively long annealing time will result in excessive In diffusion from the ITO electrode layer, which makes the In concentration distribution almost constant over the thickness range of the electrode contact layer as indicated by line ③ in FIG. 16, and fails in obtaining the above-described effect (conversely, excessively low annealing temperature or excessively short annealing time will result in shortage of the In concentration in the electrode contact layer as indicated by line ② in FIG. 16).

Assuming now in FIG. 16 that $C_A$ is the In concentration in the vicinity of the interface with the ITO electrode layer, and $C_B$ is the In concentration in the vicinity of the interface opposite thereto, a value of $C_B/C_A$ is preferably adjusted to 0.8 or below, and it is preferable to carry out the foregoing annealing so as to obtain such form of In concentration distribution. A value of $C_B/C_A$ exceeding 0.8 will result in only an insufficient improving effect of lattice matching with the light emitting layer section based on In concentration gradient. Compositional depth profile (In or Ga concentration distribution) of the electrode contact layer can be measured by known surface analytical technique such as secondary ion mass spectroscopy (SIMS), Auger electron spectroscopy (AES) and X-ray photoelectron spectroscopy (XPS), while gradually etching the layer in the depth-wise direction.

The electrode contact layer preferably has an In concentration in the vicinity of the interface with the ITO electrode layer, as being expressed by an atomic ratio of the In concentration to the total concentration of In and Ga, of 0.1 to 0.6, and it is preferable to carry out the foregoing annealing so as to obtain such In concentration. The In concentration according to the above definition less than 0.1 will result in only an insufficient effect of reducing contact resistance of the electrode contact layer, and that exceeding 0.6 will result in serious deterioration such as lowered luminous intensity due to lattice mismatching between the electrode contact layer and the light emitting layer section. It is to be noted that as far as the electrode contact layer can keep the In concentration $C_A$ in the vicinity of the interface with the ITO electrode layer typically within the above preferable range (0.1 to 0.6) as being expressed by an atomic ratio of the In concentration to the total concentration of In and Ga, there will be no problem if the In concentration $C_B$ in the vicinity of the interface opposite to that facing to the ITO electrode layer has a value of zero, which is typified by a constitution in which the electrode contact layer has an InGaAs layer formed on the ITO electrode layer side, and has a GaAs layer formed on the opposite side.

ITO refers to indium oxide doped with tin oxide as described in the above. Formation of the ITO electrode layer on the GaAs layer, and annealing thereof within a proper temperature range readily provides the electrode contact layer having an In concentration within the foregoing preferable range. The annealing is also beneficial in further reducing the electrical resistivity of the ITO electrode layer. The annealing is preferably carried out within a range from 600° C. to 750° C. The annealing temperature exceeding 750° C. tends to excessively accelerate the In diffusion into the GaAs layer, which often makes the In concentration in the electrode contact layer excessive. It is also anticipated that this makes it difficult to obtain the In concentration gradient such that being inclined along the thickness-wise direction of the electrode contact layer due to saturation of the In concentration. Both situations degrade the lattice matching between the electrode contact layer and the light emitting layer section. An excessive diffusion of In into the GaAs layer inevitably raises electrical resistivity of the electrode since In in the ITO electrode layer is exhausted around the contact area with the electrode contact layer. Still another problem of excessively high annealing temperature is that series resistance of the device is more likely to increase, which is ascribable to promoted oxidation of GaAs layer by oxygen spreaded from ITO. Both situations result in malfunction such that the light-emitting device cannot be driven at a proper voltage. An extremely high annealing temperature can even worsen the electrical resistivity of the ITO electrode layer. On the contrary, the annealing temperature lower than 600° C. will excessively reduce the diffusion rate of In into the GaAs layer, so that a longer time will be necessary to sufficiently lower the contact resistance of the electrode contact layer, which considerably ruin production efficiency.

The annealing time is preferably set within a range from 5 to 120 seconds. The annealing time longer than 120 seconds will tends to excessively raise the amount of In diffusion into the GaAs layer in particular for the case where the annealing temperature is set close to the upper limit. It is, however, allowable to set the annealing time longer than 120 seconds (typically to as long as approx. 300 seconds) when the annealing temperature is set relatively low. On the other hand, the annealing time shorter than 5 seconds will make it difficult to obtain the electrode contact layer having a sufficiently low contact resistance due to shortage in the amount of In diffusion into the GaAs layer.

BRIEF DESCRIPTION OF THE DRAWINGS

FIG. 3A shows a schematic drawing of manufacturing process of the light-emitting device shown in FIG. 1;

FIG. 3B shows a schematic drawing as continued from FIG. 3A;

FIG. 3C shows schematic drawing as continued from FIG. 3B;

FIG. 3D shows schematic drawing as continued from FIG. 3C;

FIG. 3E shows schematic drawing as continued from FIG. 3D;

FIG. 3F shows schematic drawing as continued from FIG. 3E;

FIG. 5 shows schematic drawings for explaining a patterning method for the electrode contact layer based on photo-lithography;

FIG. 7 is a schematic drawing of a first modified example of the light-emitting device shown in FIG. 1;

FIG. 8 is a schematic drawing of a second modified example of the light-emitting device shown in FIG. 1;

DETAILED DESCRIPTION OF THE PREFERRED EMBODIMENTS

Embodiments for carrying out the present invention will be explained below referring to the attached drawings.

(First Embodiment)

Figure 1:
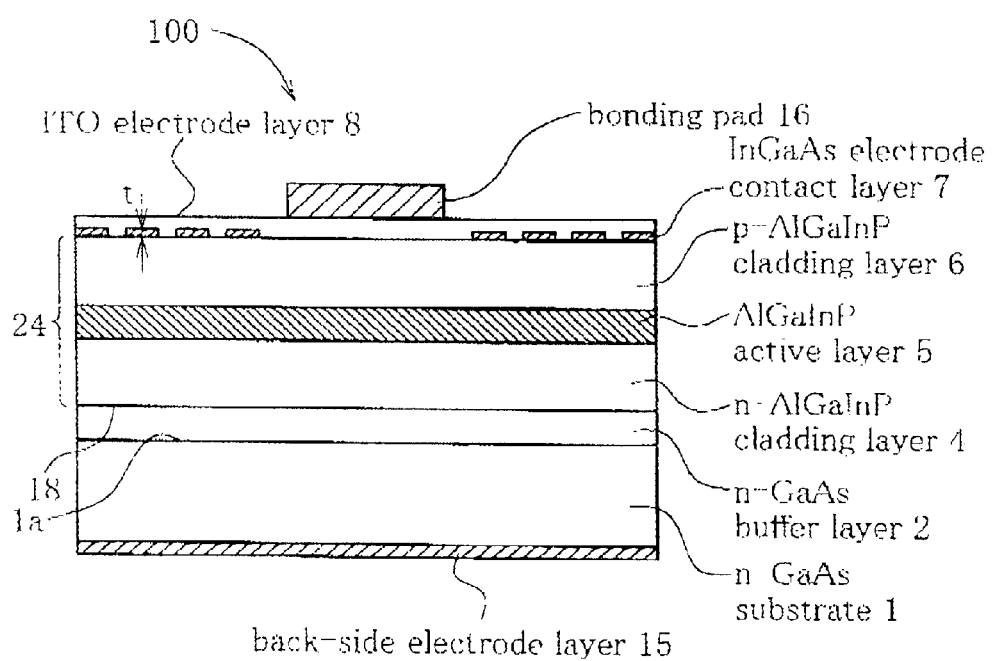
FIG. 1 is a schematic drawing of a stacked structure of an exemplary light-emitting device according to the present invention.

FIG. 1 is a schematic drawing showing a principal portion of a light-emitting device 100 according to one embodiment of the present invention. The light-emitting device 100 has an n-type GaAs single crystal substrate (simply referred to as a substrate, hereinafter) 1 and has formed on a first main surface thereof a light emitting layer section 24 while placing an n-type GaAs buffer layer 2 in between. On a first main surface side of the light emitting layer section 24, an InGaAs layer 7 as an electrode contact layer and an ITO electrode layer 8 as an oxide transparent electrode layer are formed in this order, and approximately at the center of the ITO electrode layer 8 there is provided a bonding pad 16 which is made of Au or the like so as to allow bonding of an electrode wire. On the other hand, a second main surface side of the substrate 1 has formed on the entire surface thereof a back-side electrode layer 15 which is made of a metal such as an Au—Ge—Ni alloy and also functions as a reflective layer.

The ITO electrode layer 8 herein is formed so as to cover the entire portion of the main surface of the light emitting layer section 24. On the other hand, the InGaAs layer 7 as the electrode contact layer is not formed in a first zone which falls just under the bonding pad 16 and extracts only a less amount of light, but is formed in a second zone therearound which extracts a larger amount of light. Further in the second zone, occupied areas and unoccupied areas for the InGaAs layer 7 are arranged in a mixed manner. The ITO electrode layer 8 and the light emitting layer section 24 are thus brought into a direct contact in the unoccupied areas for the InGaAs layer 7.

Figure 2A:
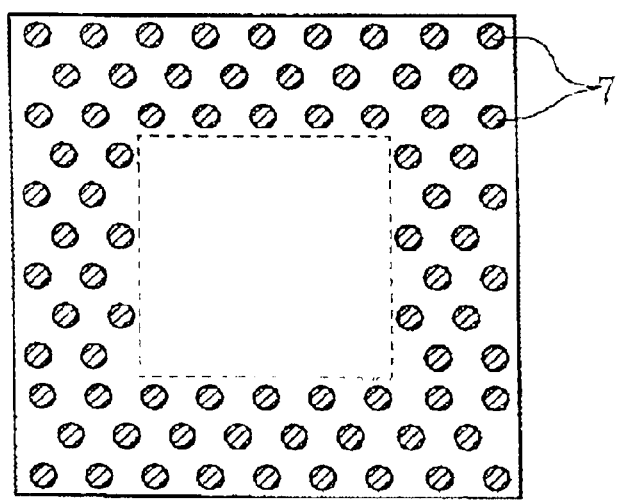
FIG. 2A shows a schematic drawing of one exemplary formation pattern of the electrode contact layer of the light-emitting device shown in FIG. 1.
Figure 2B:
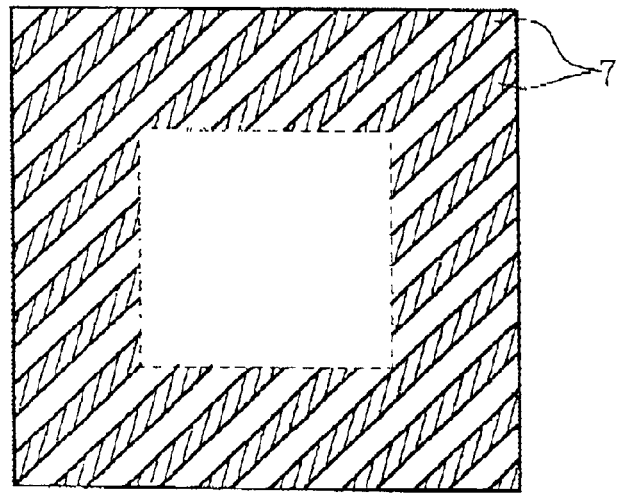
FIG. 2B shows a schematic drawing of another exemplary formation pattern of the electrode contact layer of the light-emitting device shown in FIG. 1.
Figure 2C:
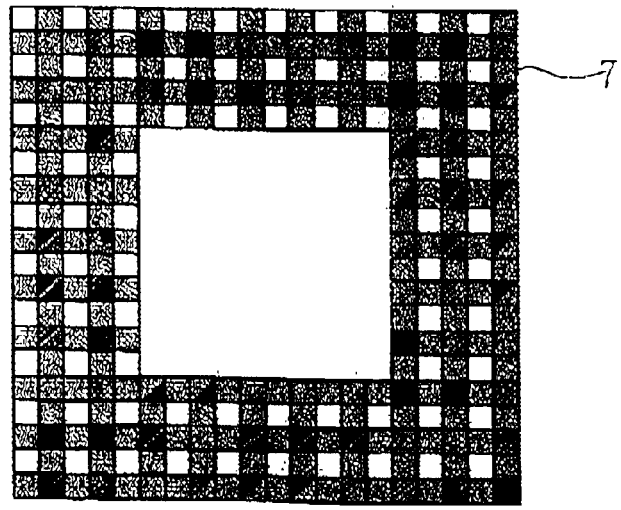
FIG. 2C shows a schematic drawing of another exemplary formation pattern of the electrode contact layer of the light-emitting device shown in FIG. 1.

As shown in FIG. 2A to FIG. 2C, the occupied areas for the InGaAs layer 7 are formed in a discrete manner on the contacting interface of the ITO electrode layer 8, which successfully homogenizes the light emission from the light emitting layer section 24, and ensures uniform extraction of the light through the unoccupied areas for the InGaAs layer 7. FIG. 2A shows the occupied areas for the InGaAs layer 7 formed in a scattered dot pattern, and FIG. 2B shows the occupied and unoccupied areas, both having a thin stripe form, arranged in an alternative manner. FIG. 2C shows the unoccupied areas for the InGaAs layer 7 formed in a scattered dot pattern on the background of the occupied area, contrary to FIG. 2A, where the occupied areas for the InGaAs layer 7 are formed in a lattice pattern.

The light emitting layer section 24 has a double heterostructure which comprises a first conductivity type cladding layer 6, a second conductivity type cladding layer 4, and an active layer 5 positioned in between, where all of the layers comprises $(Al_xGa_{1-x})_yIn_{1-y}P$ alloy. More specifically, the structure is such that having the active layer 5 composed of a non-doped $(Al_xGa_{1-x})_yIn_{1-y}P$ alloy (where $0 \leq x \leq 0.55$ and $0.45 \leq y \leq 0.55$) placed between the p-type $(Al_xGa_{1-x})_yIn_{1-y}P$ cladding layer 6 and the n-type $(Al_xGa_{1-x})_yIn_{1-y}P$ cladding layer 4. The light-emitting device 100 shown in FIG. 1 has the p-type AlGaInP cladding layer 6 on the ITO electrode 8 side, and has the n-type AlGaInP cladding layer 4 on the back-side electrode layer 15 side. Thus the device has a positive conduction polarity on the ITO electrode layer 8 side. While being obvious to those skilled in the art, "non-doped" described herein means that "dopant is not intentionally added", and will never exclude containment of dopant component which can inevitably be included during noral manufacturing processes (typically $10^{13}$ to $10^{16}/cm^3$ or around at most).

Thickness of the individual layers in the light-emitting device 100 shown in FIG. 1 are exemplified as follows.

InGaAs layer 7: thickness=approx. 0.005 μm

ITO electrode layer 8: thickness=0.2 μm, tin oxide content=7 wt % (residual portion comprises indium oxide)

p-type AlGaInP cladding layer 6: thickness=1 μm

AlGaInP active layer 5: thickness=0.6 μm n-type AlGaInP cladding layer 4: thickness=1 μm Next paragraphs will describe a method for manufacturing the light-emitting device 100 shown in FIG. 1.

First as shown in FIG. 1, on the first main surface 1a of the GaAs single crystal substrate 1 which is a compound semiconductor substrate ensuring lattice matching with AlGaInP alloy, the n-type GaAs buffer layer 2 typically having a thickness of 0.5 μm is grown, and thereon the light emitting layer section 24 is formed by stacking the n-type AlGaInP cladding layer 4 of 1 μm thick, the (non-doped) AlGaInP active layer 5 of 0.6 μm thick, and the p-type AlGaInP cladding layer 6 of 1 μm thick, and further on such p-type AlGaInP cladding layer 6 an InGaAs layer 7' (FIG. 3A) of 0.005 μm thick is formed by epitaxial growth, to thereby obtain a structure shown in FIG. 3A. Epitaxial growth of the individual layers can be carried out by known metal-organic vapor phase epitaxy (MOVPE) process.

Next as shown in FIGS. 3B and 3C, the InGaAs layer 7' is patterned by known photo-lithographic technique for every area to be processed into a light-emitting device chip, to thereby obtain either arrangement pattern of the occupied and unoccupied areas for the InGaAs layer 7 previously shown in FIG. 2A to FIG. 2C. More specifically, as shown in FIG. 3B, a photoresist layer 30 is formed on the InGaAs layer 7', and the substrate 1 is then fixed on a glass substrate using wax or the like. The photoresist layer 30 is then subjected to light exposure through a photo-mask and to development, to thereby transfer a mask pattern onto the photoresist layer 30 so as to selectively expose the InGaAs layer 7' in the unoccupied area for the InGaAs layer 7 as shown in (a) of FIG. 5. The InGaAs layer 7' is then etched selectively in the exposed portion, and the photoresist layer 30 is removed to thereby obtain the patterned InGaAs layer 7 as shown in (b) of FIG. 5.

Figure 6:
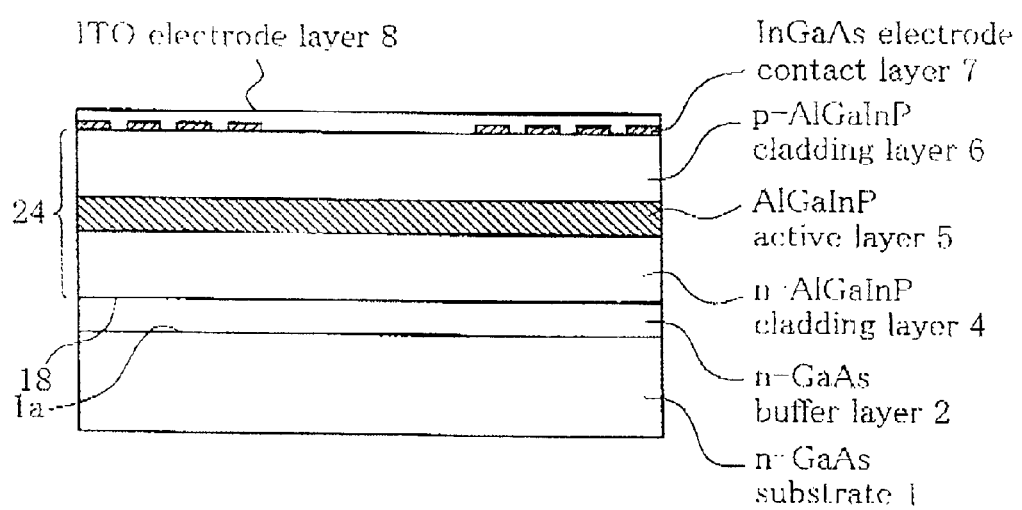
FIG. 6 is a schematic drawing of a status where an ITO electrode layer 8 is formed on the patterned electrode contact layer.

Next as shown FIG. 3D and FIG. 6, the ITO electrode layer 8 is formed typically in a thickness of 0.2 μm or around respectively on the main surfaces of both of the p-type AlGaInP cladding layer 6 and InGaAs layer 7 by known RF sputtering process (typical target composition: $In_2O_3$=90.2 wt %, $SnO_2$=9.8 wt %, RF frequency=13.56 MHz, Ar pressure=0.6 Pa, sputtering power=30 W). Resistivity of the ITO electrode layer 8 can be reduced approximately by one order by annealing thereof in a nitrogen atmosphere at 300 to 500° C. after the film formation.

Figure 4:
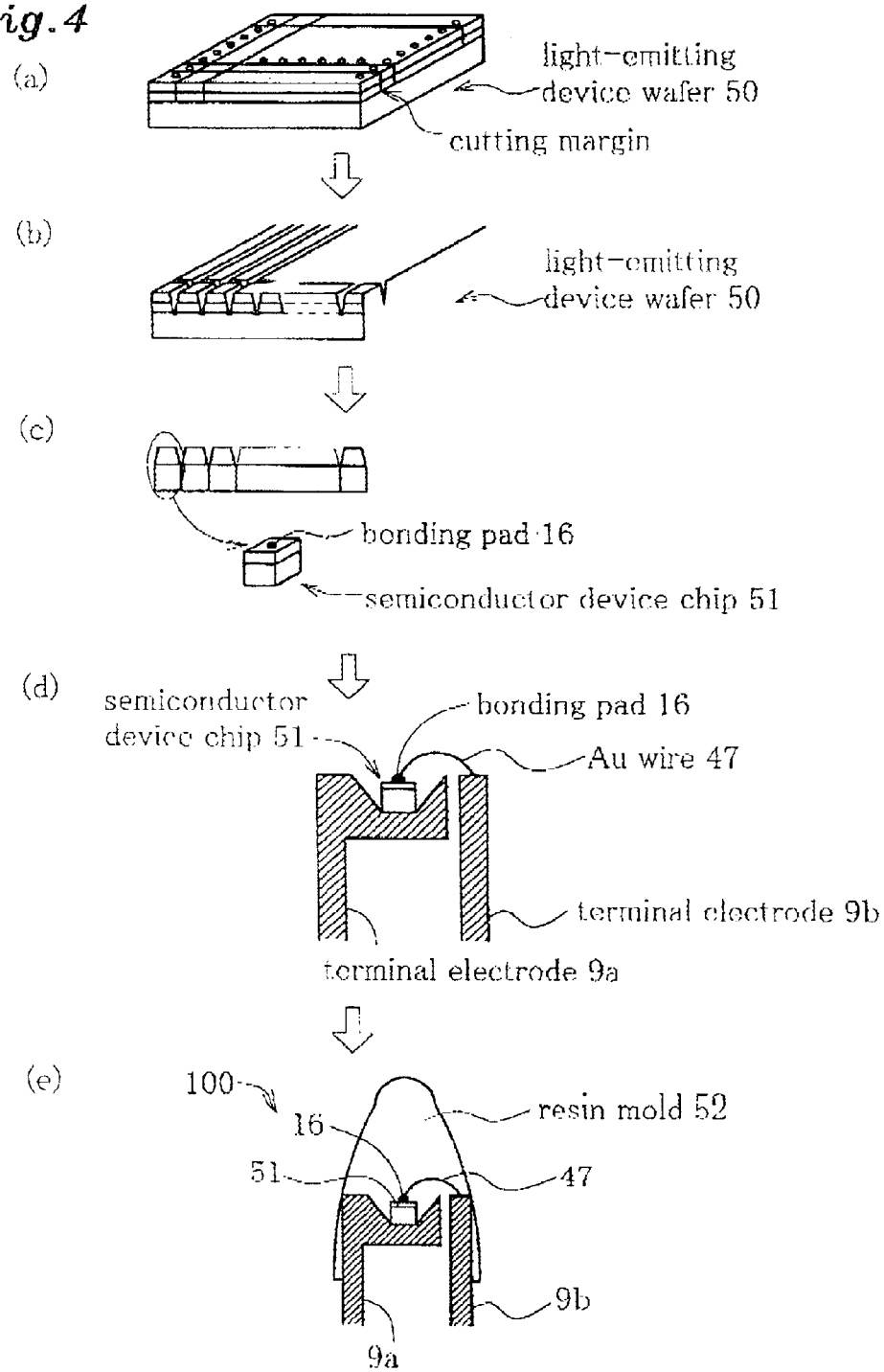
FIG. 4 shows schematic drawings as continued from FIG. 3A to FIG. 3F.

Further as shown in FIG. 3E, the back-side electrode layer is formed on the second main surface of the substrate 1 by vacuum evaporation process, and a bonding pad 16 is placed in each area corresponded to the individual light-emitting device chips on the ITO electrode layer 8 on the first main surface side. Baking for fixing the electrode at a proper temperature gives a light-emitting device wafer 50 as shown in FIG. 3F. The light-emitting device wafer 50 is then diced to a half depth in preparation for dividing the individual light-emitting device chip areas as shown in (a) of FIG. 4, mesa-etched on the dicing planes thereof in order to remove process distortion remaining therein as shown in (b) of FIG. 4, and then scribed so as to produce separated light-emitting device chips 51 as shown in (c) of FIG. 4. The back-side electrode layer 15 (see FIG. 3E and FIG. 3F) is then bonded to a terminal electrode 9a using a conductive paste such as Ag paste as shown in (d) of FIG. 4, the bonding pad 16 is bonded to another terminal electrode 9b in a form of being bridged by an Au wire 47, and a resin mold 52 is formed as shown in (e) of FIG. 4 to thereby obtain the light-emitting device.

According to the foregoing constitution of the light-emitting device, contact resistance of the ITO electrode layer 8 can be reduced by virtue of the InGaAs layer 7, which desirably raises current density in the light emitting layer section 24 and can ensure a light-emitting device with a high luminance. The mixed arrangement of the occupied and unoccupied areas for the InGaAs layer 7 in the second zone extracting a larger amount of light allows the light from the light emitting layer section 24 to be emitted in two ways, one of which relates to a route through the InGaAs layer 7, and the other relates to a route bypassing the InGaAs layer 7 in the unoccupied areas. Of these, the latter route can improve the light extraction efficiency since the light absorption which possibly occurs during passing through the InGaAs layer 7 will never occur.

On the other hand, since the bonding pad 16 blocks most part of the light from the light emitting layer section 24, it is advantageous in view of raising the light extraction efficiency that electric current is not concentrated within an area of the light emitting layer section 24 just under the bonding pad 16, or in other words, the first area extracting only a less amount of light, and conversely that a larger as possible portion of the electric current is shared to the second zone around the bonding pad 16, which zone possibly extracts a larger amount of light. Then by intentionally excluding the InGaAs layer 7 from the area just under the bonding pad 16, the light-emitting device 100 shown in FIG. 1 successfully raises contact resistance of the ITO electrode layer 8 in such area and allows a lesser amount of current to pass therethrough. This allows the current, which is applied through the ITO electrode layer 8 to the light emitting layer section 24, to predominantly be shared to the second zone which can extract a larger amount of light, after being bypassed the first zone which can extract only a lesser amount of light, to thereby raise the light extraction efficiency.

Another advantage resides in that the entire surface of the p-type AlGaInP cladding layer 6 is covered with the ITO electrode layer 8 through which the drive voltage is applied. Since the drive current caused by the drive voltage uniformly spreads throughout the entire surface of the ITO electrode layer 8 having an excellent conductivity, so that uniform light emission can be achieved over the entire plane for extracting light, and the light extraction efficiency can be improved by virtue of the transparency of the ITO electrode layer 8. The ITO electrode layer 8 is also advantageous in that ensuring ohmic contact with the InGaAs layer 7 having a relatively narrow band gap, which desirably suppresses series resistance at the contact portion and raises the emission efficiency to a large extent.

Still another advantage resides in that there will be no more need to provide a thick current spreading layer such that being employed in the conventional light-emitting device, which considerably shortens the distance between the ITO electrode layer (oxide transparent electrode layer) and emission plane, and as a result, the series resistance can be reduced. The emission plane herein is defined as described in the next. For the first case where the light emitting layer section 24 has a double heterostructure as described in the above, the emission plane is defined by a interface between the cladding layer and the active layer more closer to the oxide transparent electrode layer (ITO electrode layer 8), which refers to a interface between the p-type cladding layer 6 and active layer 5 as viewed from the ITO electrode layer 8. On the other hand, the present invention is not limited to those having a light emitting layer section with the foregoing double heterostructure, but is applicable to those having a light emitting layer section with a single heterostructure, and in the latter case the emission plane is defined by such hetero junction interface. By employing the present invention, the distance from the interface between the oxide transparent electrode layer and the electrode contact layer to the emission plane can typically be reduced to as small as 3 μm or below.

It is to be noted that the InGaAs layer 7 as the electrode contact layer can be formed so as to have a conductivity type same with that of the adjacent cladding layer 6 by adding a proper dopant, but it is also allowable to form the InGaAs layer 7 as a low-doped layer having a low dopant concentration (typically $10^{17}$ atoms/cm$^3$ or less) or as a non-doped layer ($10^{13}$ atoms/cm$^3$ to $10^{16}$ atoms/cm$^3$) when the InGaAs layer 7 is provided as a thin layer as described in the above, which raises no problem since the series resistance will not excessively increase. Employment of the low-doped layer will successfully result in an effect below depending on drive voltage for the light-emitting device. That is, employment of the low-doped layer for the electrode contact layer increases the electric resistivity per se of such layer, which elevates electric field (i.e., voltage per unit distance) to be applied to the electrode contact layer in the thickness-wise direction thereof relative to that applied to the cladding layer or the ITO layer adjacent thereto and having low electric resistivity. If the electrode contact layer is composed of InGaAs whose band gap is relatively small, the band structure of the electrode contact layer properly bends as being affected by the electric field, which results in better ohmic contact.

While FIG. 1 showed an exemplary case where the InGaAs layer 7 is excluded from the first zone (area just under the bonding pad 16) which extracts a less amount of light, it is also allowable to form the InGaAs layer 7 also in the first zone as shown in FIG. 7 provided that the current will not concentrate too excessively in the just-under area. In this case, it is desirable enough that a ratio of occupied area in which the InGaAs layer 7 is formed is smaller in the first zone which extracts a less amount of light than in the second zone which extracts a larger amount of light.

Figure 9:
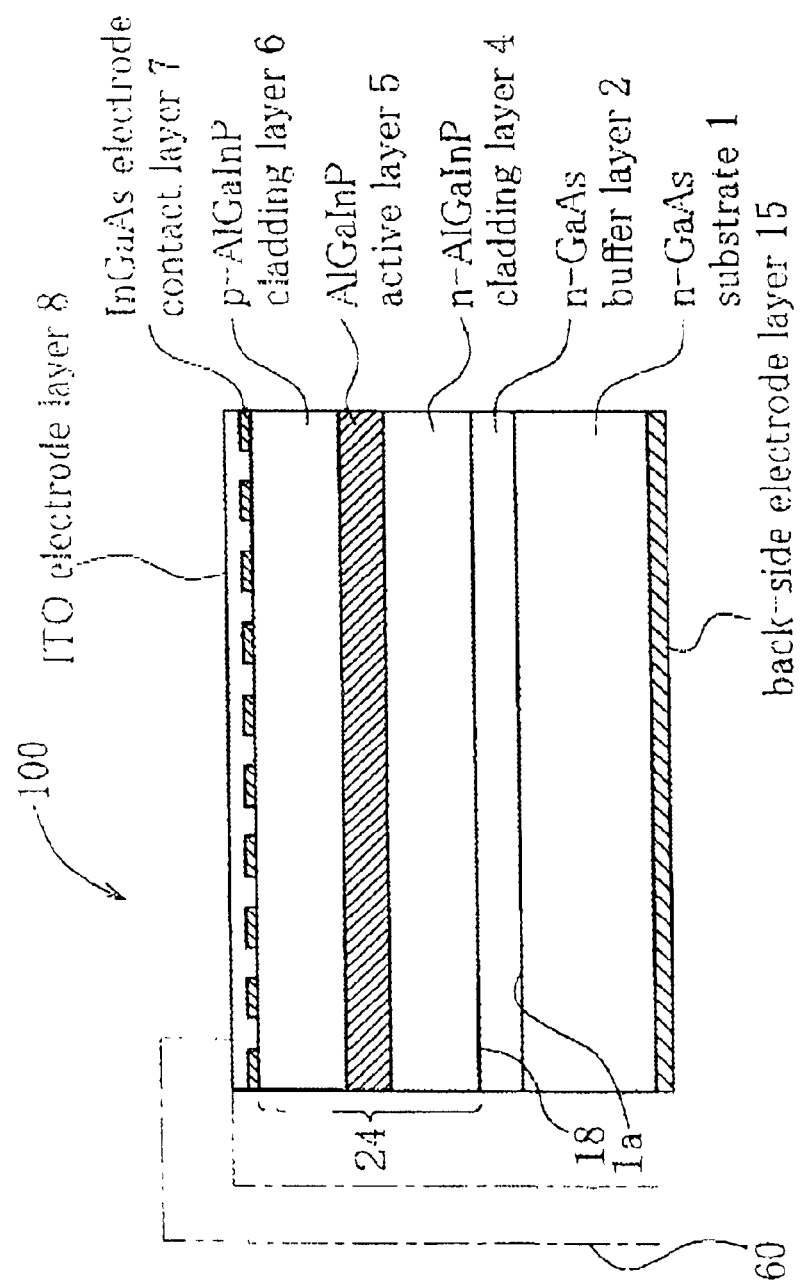
FIG. 9 is a schematic drawing of a third modified example of the light-emitting device shown in FIG. 1.

In the cases where light absorption by the electrode contact layer is of no significance, which cases being such that the thickness of the InGaAs layer 7 can be extremely reduced, or such that an electrode contact layer comprising a material other than InGaAs and showing only a small light absorption is available, it is also allowable to cover the entire surface of the second zone extracting a larger amount of light with such electrode contact layer (InGaAs layer 7 in the drawing) as shown in FIG. 8. It is still also allowable as shown in FIG. 9 to provide the occupied areas of the InGaAs layer 7 as being scattered over the entire surface of the ITO electrode layer 8 when the bonding pad can be omitted by modifying shape of a supply terminal 60 which is brought into contact with the ITO electrode layer, or when shielding of the light by the bonding pad 16 is negligible.

While the light-emitting device 100 shown in FIG. 1 has the light emitting layer section 24 having a double heterostructure in which the individual layers are composed of AlGaInP alloy, it is also allowable to compose the individual layers (p-type cladding layer, active layer and n-type cladding layer) in the light emitting layer section having a double heterostructure with AlGaInN alloy, which provides a wide-gap-type, light-emitting device for emitting blue light or ultraviolet radiation. The light emitting layer section can be formed by MOVPE process similarly to the case of light-emitting device 100 shown in FIG. 1. While the active layer has a single-layered structure in the above example, it is also allowable to compose it with a stack which comprises a plurality of compound semiconductor layers differing in the band gap energy with each other, which stack is specifically exemplified by such that having a quantum well structure.

Figure 10:
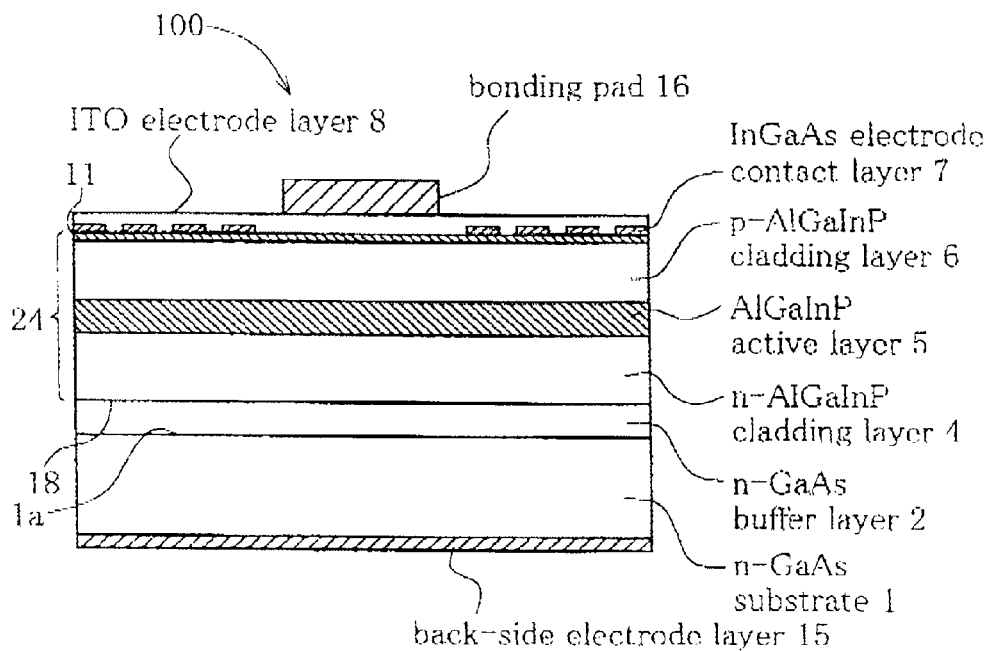
FIG. 10 is a schematic drawing of a fourth modified example of the light-emitting device shown in FIG. 1.

For the case where the InGaAs layer and AlGaInP layers are directly contacted, there will be some possible cases in which somewhat high hetero barrier appears at the junction interface, which undesirably increases series resistance component. For the purpose of reducing such component, it is preferable to insert an intermediate layer 11 between the electrode contact layer 7 which comes into contact with the ITO electrode layer 8 and the AlGaInP cladding layer 6 as shown in FIG. 10, where the intermediate layer 11 has an intermediate band gap energy between those of the electrode contact layer 7 and such cladding layer 6. The intermediate layer 11 can be composed of a layer containing at least any one of AlGaAs, GaInP and AlGaInP layers, where the entire portion of the intermediate layer 11 can typically be composed of an AlGaAs layer alone. Since any layers for composing the intermediate layer 11 can be formed as thin as 0.1 $\mu$m or below (but 0.01 $\mu$m or above, because the thickness smaller than 0.01 $\mu$m will ruin the bulk band structure, and a desired junction structure cannot be obtained), the employment of such constitution can still ensure shortening of epitaxial growth time by virtue of the thinning, improvement in the productivity as a consequence, and can also ensure less increment in the series resistance caused by the formation of the intermediate layer, which is unlikely to ruin the emission efficiency. In the present invention, the electrode contact layer 7 is formed only so as to correspond with a part of the ITO electrode layer 8 formed on the light extracting plane side, so that current density during current supply for light emission tends to selectively increase in the occupied areas for the electrode contact layer 7. The hetero barrier formed undesirably high between the electrode contact layer 7 and AlGaInP cladding layer 6 will cause more serious voltage drop due to current concentration when carriers pass through the junction interface between the electrode contact layer 7 and AlGaInP cladding layer 6, which results in further increase in the apparent series resistance. It is thus concluded that lowering of the hetero barrier height by forming the intermediate layer 11 is more beneficial than the case where the electrode contact layer 7 is formed on the entire surface of the ITO electrode layer 8.

Figure 11:
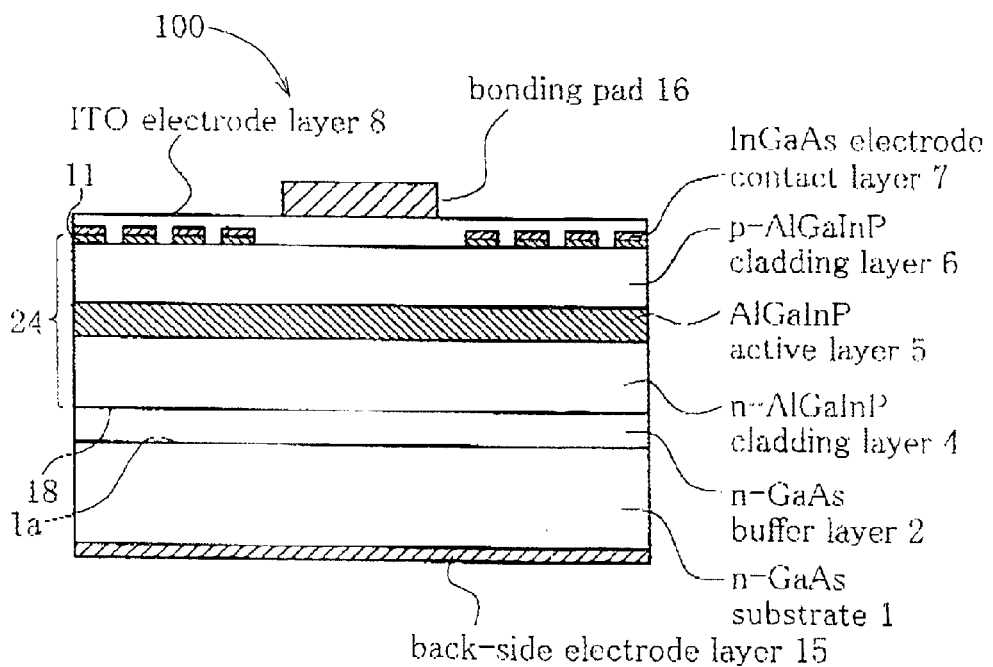
FIG. 11 is a schematic drawing of a fifth modified example of the light-emitting device shown in FIG. 1.
Figure 12:
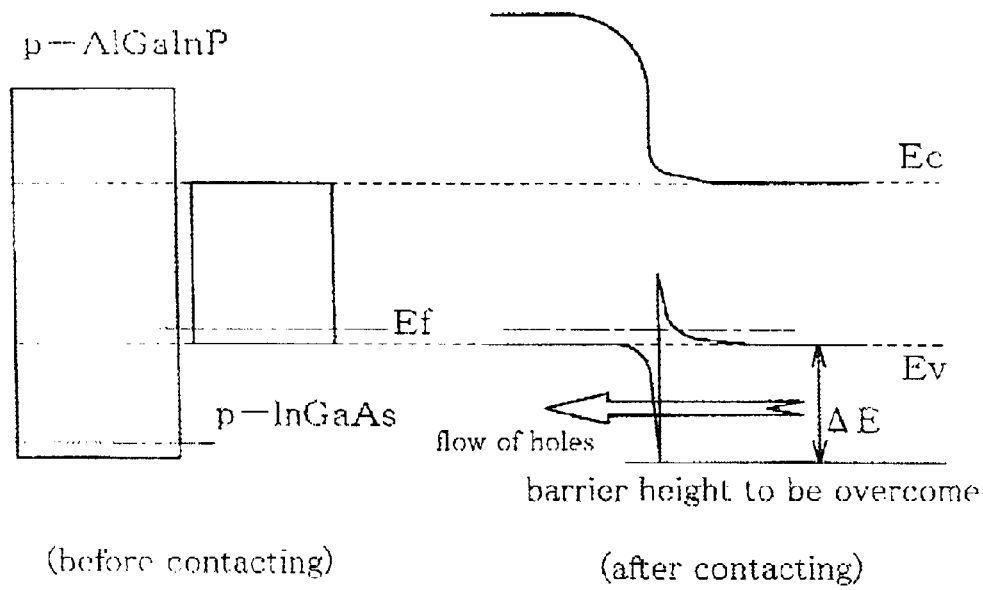
FIG. 12 is a first example of a band structure of the electrode contact layer.
Figure 13:
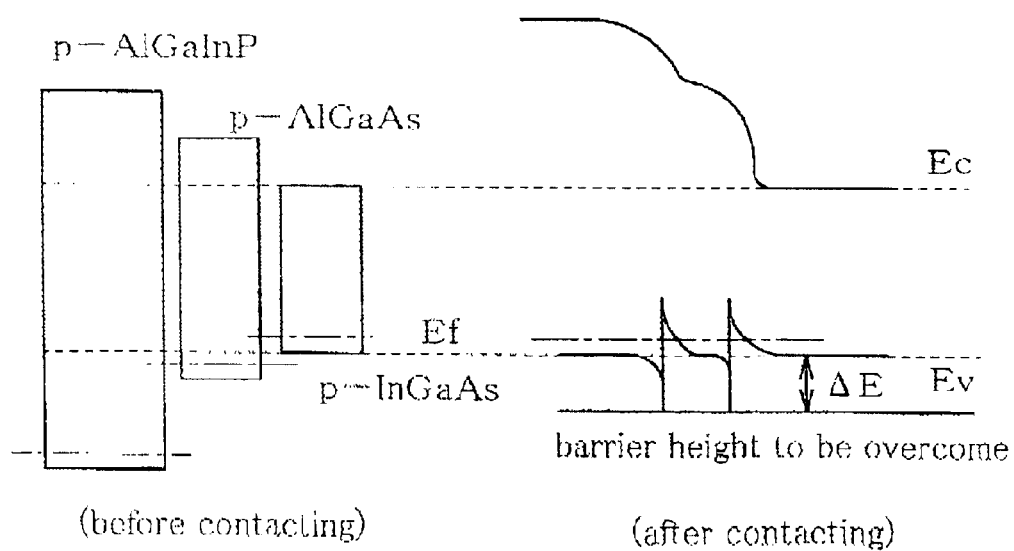
FIG. 13 is a second example of a band structure of the electrode contact layer.

It is to be noteworthy that the intermediate layer 11 can be formed so as to cover the entire surface of the light emitting layer section 24 as shown in FIG. 10, when it is less causative of adverse effect on the light absorption, which is typified by a case where the intermediate layer 11 has an extra-small thickness. Such constitution allows only the electrode contact layer 7 to be patterned, which facilitates the production process even when etchant used in chemical etching of the electrode contact layer 7 cannot effectively etch the intermediate layer 11. On the other hand, it is also allowable to form the intermediate layer 11 only in the occupied area for the electrode contact layer 7 as shown in FIG. 11, which further reduces effect of light absorption by the intermediate layer 11. A possible manufacturing process for this case is such that forming the electrode contact layer 7 and intermediate layer 11 so as to cover the entire surface of the light emitting layer section 24, and patterning these layers by photo-lithographic technique as described in the above. In the patterning, the electrode contact layer 7 and intermediate layer 11 maybe etched concomitantly by gas-phase etching, or may be etched serially while changing the etchants by chemical etching. In some cases where the electrode contact layer 7 is patterned by chemical etching, the intermediate layer 11 may be used as a stopper layer for preventing the light emitting layer section 24 from being corroded. In an exemplary case where the electrode contact layer 7 is composed of In-containing GaAs and the intermediate layer 11 of AlGaAs, using ammonia/hydrogen peroxide as an etchant successfully allows selective etching of the electrode contact layer 7 only, while making use of the intermediate layer 11 as the stopper layer.

(Second Embodiment)

Figure 14:
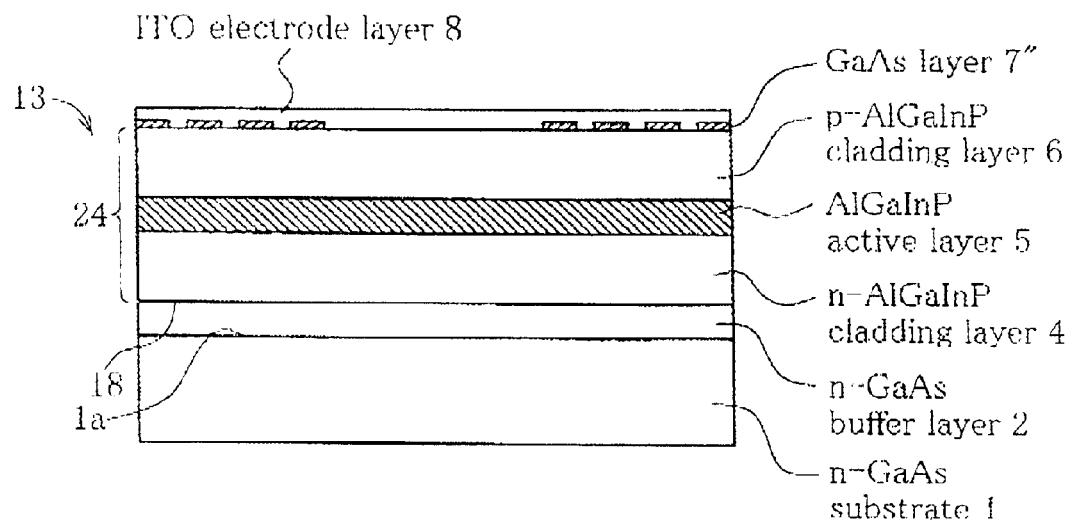
FIG. 14 is a schematic drawing of a production process by which In in the ITO transparent electrode is spreaded into the GaAs layer to produce the electrode contact layer.

While the electrode contact layer described above in the First Embodiment was the InGaAs layer formed by MOVPE process, the electrode contact layer can be formed also by the following process. Referring now to (b) of FIG. 5, a GaAs layer 7" is formed in place of the InGaAs layer 7 while being similarly patterned, then the ITO electrode layer 8 is formed similarly to that shown in FIG. 6, to thereby obtain a stacked wafer 13 as shown in FIG. 14.

Figure 15:
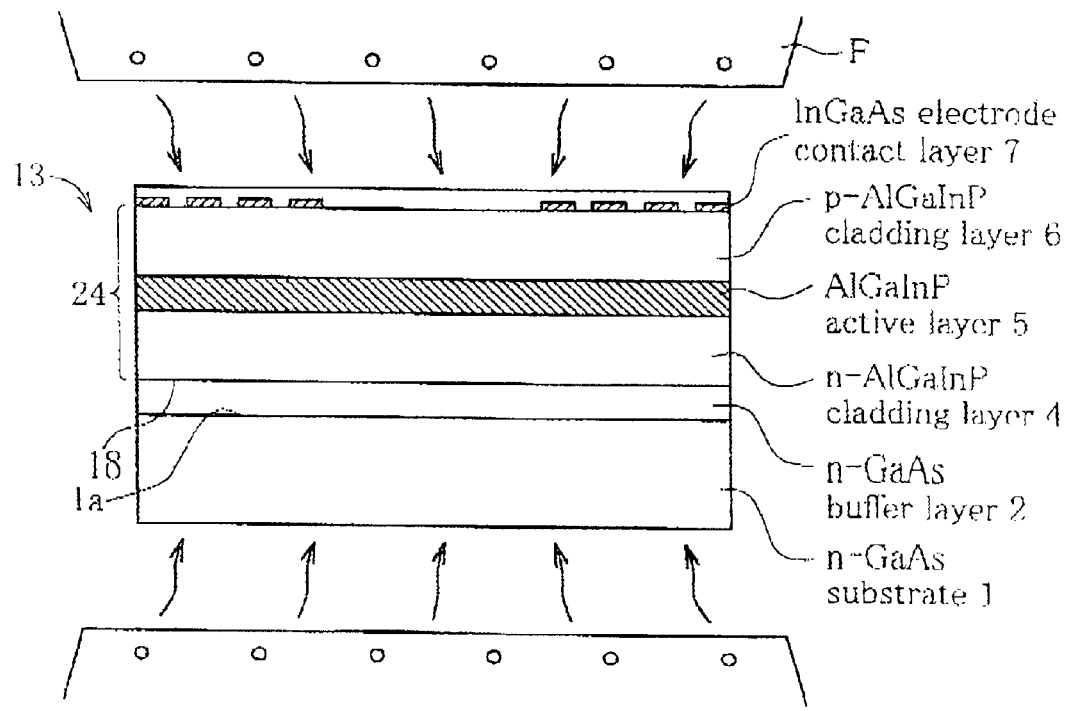
FIG. 15 is a schematic drawing as continued from FIG. 14.

Then as shown in FIG. 15, the stacked wafer 13 is placed in a furnace F, and then annealed in a nitrogen atmosphere or an inert gas atmosphere such as Ar at a low temperature ranging from 600 to 750° C. (typically 700° C.) for a short period ranging from 5 to 120 seconds (typically 30 seconds). This process allows In to diffuse from the ITO electrode layer 8 to the GaAs layer 7" to thereby form the electrode contact layer 7 composed of In-containing GaAs. The electrode contact layer 7 has an In concentration as indicated by line ① in FIG. 16, where the In concentration in the vicinity of the interface with the ITO electrode layer 8 is 0.1 to 0.6 when expressed by an atomic ratio of the In concentration to the total concentration of In and Ga. Another feature of the In concentration is that it continuously decreases as the distance from the ITO electrode layer increases along the thickness-wise direction, and that it is adjusted to have a value of $C_B/C_A$ of 0.8 or below, while assuming $C_A$ as the In concentration in the vicinity of the interface with the ITO electrode layer 8 (FIG. 1), and $C_B$ as the In concentration in the vicinity of the interface opposite thereto (that is, in the vicinity of the interface with the cladding layer 6, see FIG. 1). The thickness t of the electrode contact layer 7 is 0.01 to 0.02 μm, and more preferably 0.005 to 0.01 μm.

Since the electrode contact layer 7 is obtained by first forming the GaAs layer 7" which has a good lattice matching with the light emitting layer portion 24 composed of AlGaInP, forming the ITO electrode layer, and then annealing it at a relatively low temperature for a short period, so that the In content thereof will never be excessive, but will be uniform and excellently continuous. This successfully prevents the quality degradation such as lowered luminous intensity due to lattice mismatching with the light emitting layer section 24.

Figure 16:
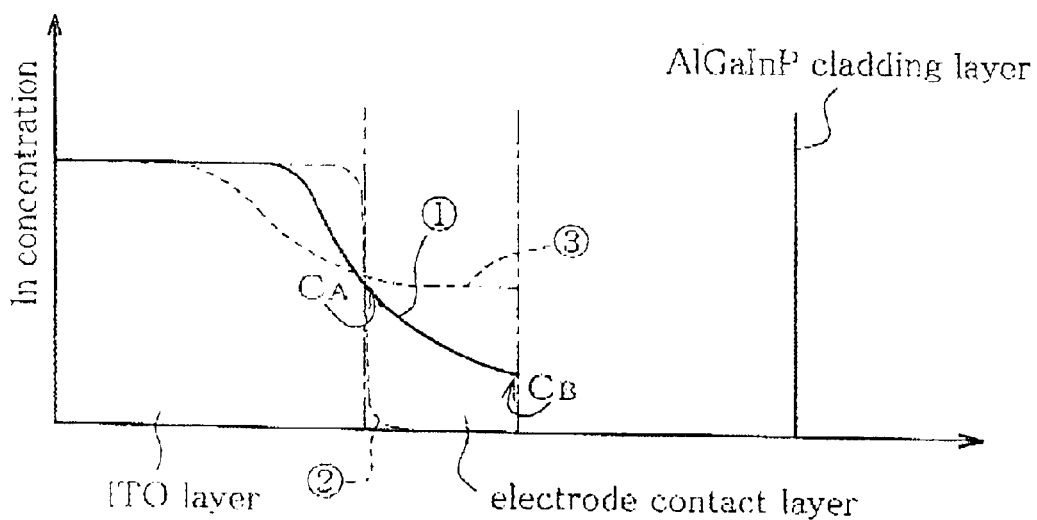
FIG. 16 is a schematic drawing showing an exemplary In concentration distribution in the electrode contact layer produced by the process shown in FIGS. 14 and 15 together with comparative examples.
Figure 17:
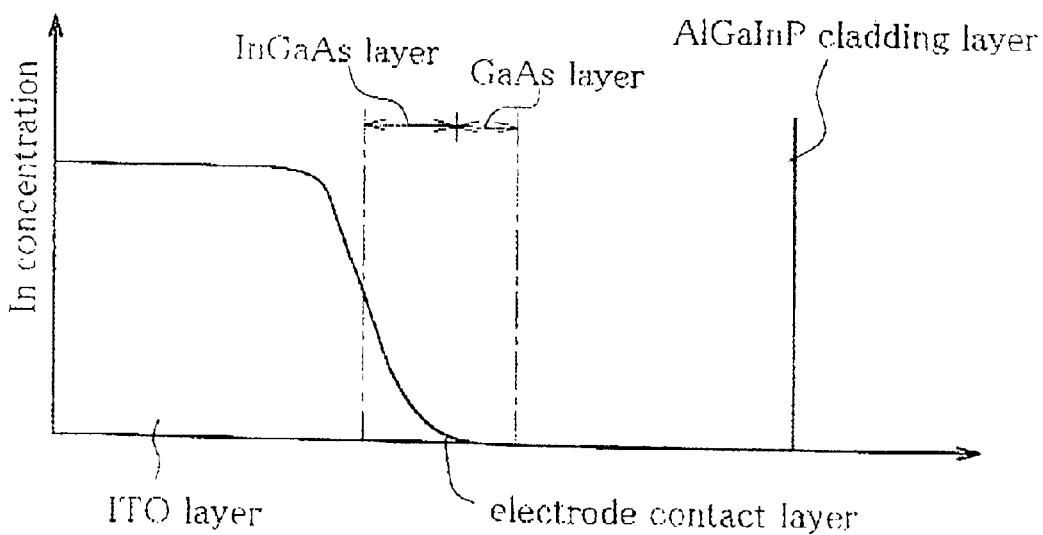
FIG. 17 is a schematic drawing of another example of In concentration distribution in the electrode contact layer.

While the electrode contact layer 7 can be formed by being added with an appropriate dopant so as to have the same conductivity type with the cladding layers 6, 4 contact thereto, a low-doped layer having a low dopant concentration (typically $10^{17}/cm^3$ or below, or non-doped layer having a dopant concentration of $10^{13}/cm^3$ to $10^{16}/cm^3$), which will never result in increase in the series resistance, can be formed as the electrode contact layer 7 without any problems when it is formed as thin as described in the above. The low-doped layer is also beneficial in that ensuring the following effects depending on drive voltage of the light-emitting device. That is, the electrode contact layer 7 per se will have a high electrical resistivity due to a low dopant concentration, and thus will have an electric field applied thereto in the thickness-wise direction thereof (i.e., voltage per unit distance) relatively higher than that applied to the low-resistivity cladding layer or the ITO electrode layer 8 directly adjacent to such electrode contact layer 7. Forming now the electrode contact layer 7 with In-containing GaAs having a relatively small band gap will produce proper bend in the band structure of the electrode contact layer upon application of the electric field, which successfully forms still better ohmic contact. This effect will further be enhanced since the In concentration of the electrode contact layer 7 is raised on the contact side with the ITO electrode layer 8 as shown in FIG. 16. It is allowable also in this embodiment to form the intermediate layer 11 in an absolutely similar manner with the first embodiment.

What is claimed is:

1. A light-emitting device having a light emitting layer section which comprises a compound semiconductor layer, and an oxide transparent electrode layer for applying drive voltage for light emission to the light emitting layer section, which device being composed so that the light from the light emitting layer section can be extracted through the oxide transparent electrode layer, wherein an electrode contact layer for reducing contact resistance of the oxide transparent electrode layer is arranged between the light emitting layer section and the oxide transparent electrode layer so as to contact with such oxide transparent electrode layer, where on a contacting interface of such oxide transparent electrode layer, occupied areas and unoccupied areas for the electrode contact layer are arranged in a mixed manner;

the light emitting layer section is composed of $(Al_xGa_{1-x})_yIn_{1-y}P$ (where $0 \leq x \leq 1$ and $0 \leq y \leq 1$) or $In_xGa_yAl_{1-x-y}N$ (where $0 \leq x \leq 1$ and $x+y \leq 1$);

the light emitting layer section has a double heterostructure which comprises a first conductivity type cladding layer, an active layer and a second conductivity type cladding layer stacked in this order, which layers being respectively composed of the above-described $(Al_xGa_{1-x})_yIn_{1-y}P$ and the electrode contact layer is formed between the oxide transparent electrode layer and at least either of the first conductivity type cladding layer and second conductivity type cladding layer;

an ITO electrode layer is provided as the oxide transparent electrode on either side of the first conductivity type cladding layer and the second conductivity type cladding layer so that the light from the light emitting layer section can be extracted through such ITO electrode layer, and the electrode contact layer composed of In-containing GaAs is formed so as to contact with such ITO electrode layer; and the electrode contact layer has a distribution of the In concentration along the thickness-wise direction thereof such that continuously decreasing as the distance from the ITO electrode layer increases.

2. The light-emitting device according to claim 1, wherein the electrode contact layer comprises a compound semiconductor.

3. The light-emitting device according to claim 1, wherein the contacting interface of the oxide transparent electrode layer has a first zone which comprises an area just under a bonding pad placed on such oxide transparent electrode layer and a second zone which comprises the residual area therearound, where the second zone is larger in the amount of extracted light than the first zone, and the electrode contact layer is formed with a larger ratio of occupied area in the second zone than in the first zone.

4. The light-emitting device according to claim 3, wherein the first zone has formed therein no electrode contact layer.

5. The light-emitting device according to claim 3, wherein at least the second zone has formed therein the occupied areas and unoccupied areas for the electrode contact layer arranged in a mixed manner.

6. The light-emitting device according to claim 5, wherein the occupied areas for the electrode contact layer are formed in a discrete manner in the second zone.

7. The light-emitting device according to claim 1, wherein the electrode contact layer comprises a compound semiconductor containing no aluminum at the contacting interface with the oxide transparent electrode layer, and having a band gap energy of less than 1.42 eV.

8. The light-emitting device according to claim 7, wherein the compound semiconductor composing the electrode contact layer is expressed as $In_xGa_{1-x}As$ ($0<x \leq 1$) at the contacting interface with the oxide transparent electrode layer.

9. The light-emitting device according to claim 1, wherein the oxide transparent electrode layer is an oxide electrode layer containing at least any one of indium, tin and zinc.

10. The light-emitting device according to claim 1, wherein the thickness of the electrode contact layer is adjusted within a range from 0.001 μm to 0.02 μm.

11. The light-emitting device according to claim 1, wherein an intermediate layer is formed between the electrode contact layer and either of the cladding layers facing to the electrode contact layer, which is selected from the first conductivity type cladding layer and the second conductivity type cladding layer, the intermediate layer having an intermediate band gap energy between those of the electrode contact layer and such cladding layer.

12. The light-emitting device according to claim 11, wherein the light emitting layer section is composed of $(Al_xGa_{1-x})_yIn_{1-y}P$ (where $0 \leq x \leq 1$ and $0y \leq 1$), and the intermediate layer is formed as including at least one of AlGaAs layer, GaInP layer and AlGaInP layer.

13. The light-emitting device according to claim 1, wherein the electrode contact layer has a value of $C_B/C_A$ of 0.8 or below, assuming $C_A$ as the In concentration in the vicinity of the interface with the ITO electrode layer, and $C_B$ as the In concentration in the vicinity of the interface opposite thereto.

14. The light-emitting device according to claim 13, wherein the electrode contact layer has an In concentration in the vicinity of the interface with the ITO electrode layer, as being expressed by an atomic ratio of the In concentration to the total concentration of In and Ga, of 0.1 to 0.6.

15. The light-emitting device according to claim 1, wherein the electrode contact layer has an In concentration in the vicinity of the interface with the ITO electrode layer, as being expressed by an atomic ratio of the In concentration to the total concentration of In and Ga, of 0.1 to 0.6.

16. A light-emitting device having a light emitting layer section which comprises a compound semiconductor layer, and an oxide transparent electrode layer for applying drive voltage for light emission to the light emitting layer section, which device being composed so that the light from the light emitting layer section can be extracted through the oxide transparent electrode layer, wherein an electrode contact layer, composed of a compound semiconductor, for reducing contact resistance of the oxide transparent electrode layer is arranged between the light emitting layer section and the oxide transparent electrode layer so as to contact with such oxide transparent electrode layer;

the contacting interface of the oxide transparent electrode layer has a first zone which comprises an area just under bonding pads and a second zone which comprises the residual area, where the second zone is larger in the amount of extracted light than the first zone;

at least the second zone has formed therein the occupied areas and unoccupied areas for the electrode contact layer arranged in a mixed manner;

the light emitting layer section is composed of $(Al_xGa_{1-x})_yIn_{1-y}P$ (where $0 \leq x \leq 1$ and $0 \leq y \leq 1$) or $In_xGa_yAl_{1-x-y}N$ (where $0 \leq x \leq 1$, $0 \leq y \leq 1$ and $x+y \leq 1$);

the light emitting layer section has a double heterostructure which comprises a first conductivity type cladding layer, an active layer and a second conductivity type cladding layer stacked in this order, which layers being respectively composed of the above-described $(Al_xGa_{1-x})_yIn_{1-y}P$ or $In_xGa_yAl_{1-x-y}N$, and the electrode contact layer is formed between the oxide transparent electrode layer and at least either of the first conductivity type cladding layer and second conductivity type cladding layer;

an ITO electrode layer is provided as the oxide transparent electrode on either side of the first conductivity type cladding layer and the second conductivity type cladding layer so that the light from the light emitting layer section can be extracted through such ITO electrode layer, and the electrode contact layer composed of In-containing GaAs is formed so as to contact with such ITO electrode layer; and the electrode contact layer has a distribution of the In concentration along the thickness-wise direction thereof such that continuously decreasing as the distance from the ITO electrode layer increases.

17. The light-emitting device according to claim 16, wherein the occupied areas for the electrode contact layer are formed in a discrete manner in the second zone.

18. The light-emitting device according to claim 16, wherein the electrode contact layer comprises a compound semiconductor containing no aluminum at the contacting interface with the oxide transparent electrode layer, and having a band gap energy of less than 1.42 eV.

19. The light-emitting device according to claim 18, wherein the compound semiconductor composing the electrode contact layer is expressed as $In_xGa_{1-x}As$ ($0 < x \leq 1$) at the contacting interface with the oxide transparent electrode layer.

20. The light-emitting device according to claim 16, wherein the oxide transparent electrode layer is an oxide electrode layer containing at least any one of indium, tin and zinc.

21. The light-emitting device according to claim 16, wherein the thickness of the electrode contact layer is adjusted within a range from 0.001 $\mu$m to 0.02 $\mu$m.

22. The light-emitting device according to claim 16, wherein an intermediate layer is formed between the electrode contact layer and either of the cladding layers facing to the electrode contact layer, which is selected from the first conductivity type cladding layer and the second conductivity type cladding layer, the intermediate layer having an intermediate band gap energy between those of the electrode contact layer and such cladding layer.

23. The light-emitting device according to claim 22, wherein the light emitting layer section is composed of $(Al_xGa_{1-x})_yIn_{1-y}P$ (where $0 \leq x \leq 1$ and $0y \leq 1$), and the intermediate layer is formed as including at least one of AlGaAs layer, GaInP layer and AlGaInP layer.

24. The light-emitting device according to claim 1, wherein the electrode contact layer has a value of $C_B/C_A$ of 0.8 or below, assuming $C_A$ as the In concentration in the vicinity of the interface with the ITO electrode layer, and $C_3$ as the In concentration in the vicinity of the interface opposite thereto.

25. The light-emitting device according to claim 24, wherein the electrode contact layer has an In concentration in the vicinity of the interface with the ITO electrode layer, as being expressed by an atomic ratio of the In concentration to the total concentration of In and Ga, of 0.1 to 0.6.

26. The light-emitting device according to claim 16, wherein the electrode contact layer has an In concentration in the vicinity of the interface with the ITO electrode layer, as being expressed by an atomic ratio of the In concentration to the total concentration of In and Ga, of 0.1 to 0.6.

27. A method for manufacturing light-emitting device having a light emitting layer section which is composed of $(Al_xGa_{1-x})_yIn_{1-y}P$ (where $0 \leq x \leq 1$ and $0y \leq 1$), as having a double heterostructure which comprises a first conductivity type cladding layer, an active layer and a second conductivity type cladding layer stacked in this order; and having an ITO electrode layer for applying drive voltage for light emission to such light emitting layer section provided on either side of the first conductivity type cladding layer and the second conductivity type cladding layer, comprising the steps of:

forming a GaAs layer on the light emitting layer section so that occupied areas and unoccupied areas for the GaAs layer are arranged in a mixed manner;

forming the ITO transparent conductive layer so as to contact with the GaAs layer; and annealing the ITO electrode layer so as to allow In contained therein to diffuse into the GaAs layer to thereby convert such GaAs layer into an In-containing electrode contact layer.

28. The method for manufacturing light-emitting device according to claim 27, wherein the annealing is carried out so that the electrode contact layer will have a distribution of the In concentration along the thickness-wise direction thereof such that continuously decreasing as the distance from the ITO electrode layer increases.

29. The method for manufacturing light-emitting device according to claim 27, wherein the annealing is carried out so that the electrode contact layer will have a value of $C_B/C_A$ of 0.8 or below, assuming $C_A$ as the In concentration in the vicinity of the interface with the ITO electrode layer, and $C_B$ as that in the vicinity of the interface opposite thereto.

30. The method for manufacturing light-emitting device according to claim 27, wherein the annealing is carried out so that the electrode contact layer will have an In concentration in the vicinity of the interface with the ITO electrode layer, as being expressed by an atomic ratio of the In concentration to the total concentration of In and Ga, of 0.1 to 0.6.

31. The method for manufacturing light-emitting device according to claim 27, wherein the annealing is carried out within a temperature range from 600 to 750° C.

32. The method for manufacturing light-emitting device according to claim 27, wherein the annealing is carried out within a duration of time from 5 to 120 seconds.

33. A light-emitting device having a light emitting layer section which comprises a compound semiconductor layer, and an oxide transparent electrode layer for applying drive voltage for light emission to the light emitting layer section, which device being composed so that the light from the light emitting layer section can be extracted through the oxide transparent electrode layer, wherein an electrode contact layer for reducing contact resistance of the oxide transparent electrode layer is arranged between the light emitting layer section and the oxide transparent electrode layer so as to contact with such oxide transparent electrode layer, where on a contacting interface of such oxide transparent electrode layer, occupied areas and unoccupied areas for the electrode contact layer are arranged in a mixed manner;

the compound semiconductor composing the electrode contact layer is expressed as $In_xGa_{1-x}As$ ($0<x\leq1$) at the contacting interface with the oxide transparent electrode layer; and the thickness of the electrode contact layer is adjusted within a range from 0.001 μm to 0.02 μm.

34. The light-emitting device according to claim 33, wherein the electrode contact layer comprising $In_xGa_{1-x}As$ is a low-doped layer having a dopant concentration of $1\times10^{17}$ sites/cm³ or less, or a non-doped layer.

35. The light-emitting device according to claim 33, wherein the compound semiconductor composing the electrode contact layer is expressed as $In_xGa_{1-x}As$ ($0.1\leq x\leq0.6$) at the contacting interface with the oxide transparent electrode layer.

* * * * *

UNITED STATES PATENT AND TRADEMARK OFFICE
CERTIFICATE OF CORRECTION

PATENT NO. : 6,787,383 B2
DATED : September 7, 2004
INVENTOR(S) : Shunichi Ikeda et al.

It is certified that error appears in the above-identified patent and that said Letters Patent is hereby corrected as shown below:

Column 18,
Line 11, delete "$0 \leq x \leq 1$ and $x+Y \leq 1$" and substitute therefore
-- $0 \leq x \leq 1$, $0 \leq y \leq 1$ and $x+Y \leq 1$ --
Line 17, after " $(Al_xGa_{1-x})_yIn_{1-y}P$" insert -- or $In_xGa_yAl_{1-x-y}N$, --

Column 19,
Line 11, delete "$0y \leq 1$" and substitute therefore -- $0 \leq y \leq 1$ --
Line 53, delete "$In_xGa_yAl_{1-x-y}N$" and substitute therefore -- $In_xGa_yAl_{1-x-y}N$ --

Column 20,
Line 38, delete "$0y \leq 1$" and substitute therefore -- $0 \leq y \leq 1$ --
Line 41, delete "claim 1" and substitute therefore -- claim 16 --
Line 44, delete "$C_3$" and substitute therefore -- $C_B$ --
Line 59, delete "$0y \leq 1$" and substitute therefore -- $0 \leq y \leq 1$ --

Signed and Sealed this

Nineteenth Day of April, 2005

JON W. DUDAS
*Director of the United States Patent and Trademark Office*